United States Patent
Shibazaki et al.

(10) Patent No.: US 8,435,723 B2
(45) Date of Patent: May 7, 2013

(54) PATTERN FORMING METHOD AND DEVICE PRODUCTION METHOD

(75) Inventors: Yuichi Shibazaki, Kumagaya (JP); Shigeru Hirukawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 554 days.

(21) Appl. No.: 12/585,079

(22) Filed: Sep. 2, 2009

(65) Prior Publication Data

US 2010/0068660 A1 Mar. 18, 2010

Related U.S. Application Data

(60) Provisional application No. 61/136,511, filed on Sep. 11, 2008, provisional application No. 61/136,512, filed on Sep. 11, 2008.

(51) Int. Cl.
*G03F 7/26* (2006.01)

(52) U.S. Cl.
USPC .......................................................... 430/313

(58) Field of Classification Search .................. 430/311, 430/322, 313, 314, 323, 324
See application file for complete search history.

(56) References Cited

U.S. PATENT DOCUMENTS

| | | | |
|---|---|---|---|
| 4,564,583 A | 1/1986 | Maeguchi | |
| 5,448,332 A | 9/1995 | Sakakibara et al. | |
| 5,922,516 A | 7/1999 | Yu et al. | |
| 5,969,441 A | 10/1999 | Loopstra et al. | |
| 6,208,407 B1 | 3/2001 | Loopstra | |
| 6,590,634 B1 | 7/2003 | Nishi et al. | |
| 6,778,257 B2 | 8/2004 | Bleeker et al. | |
| 6,897,963 B1 | 5/2005 | Taniguchi et al. | |
| 2003/0025890 A1 | 2/2003 | Nishinaga | |
| 2003/0186547 A1 | 10/2003 | Koh et al. | |
| 2005/0248856 A1 | 11/2005 | Omura et al. | |
| 2007/0291239 A1 | 12/2007 | Shiraishi | |
| 2009/0219496 A1 | 9/2009 | Kamm et al. | |

FOREIGN PATENT DOCUMENTS

| | | |
|---|---|---|
| DE | 675 529 | 5/1939 |
| DE | 756 886 | 10/1952 |
| JP | A-6-283403 | 10/1994 |
| JP | A-2000-182923 | 6/2000 |
| JP | A-2001-135565 | 5/2001 |
| JP | A-2001-313250 | 11/2001 |
| JP | A-2007-311508 | 11/2007 |
| WO | WO 99/23692 | 5/1999 |
| WO | WO 01/35168 A1 | 5/2001 |
| WO | WO 2005/122218 A1 | 12/2005 |

OTHER PUBLICATIONS

International Search Report issued in International Application No. PCT/JP2009/065977; Mailed Dec. 29, 2009.

Widmann, D. et al., "Technologie Hochintegrierter Schaltungen," Technologie Hochintegrierter Schaltungen, Springer Verlag, Jan. 1, 1996, pp. 105-142.

*Primary Examiner* — Kathleen Duda

(74) *Attorney, Agent, or Firm* — Oliff & Berridge, PLC

(57) ABSTRACT

A pattern forming method includes coating, on a wafer, a negative resist and a positive resist which has a higher sensitivity; exposing the positive resist and the negative resist on the wafer with an image of a line-and-space pattern; and developing the positive resist and the negative resist in a direction parallel to a normal line of a surface of the wafer. A fine pattern, which exceeds the resolution limit of an exposure apparatus, can be formed by using the lithography process without performing the overlay exposure.

38 Claims, 14 Drawing Sheets

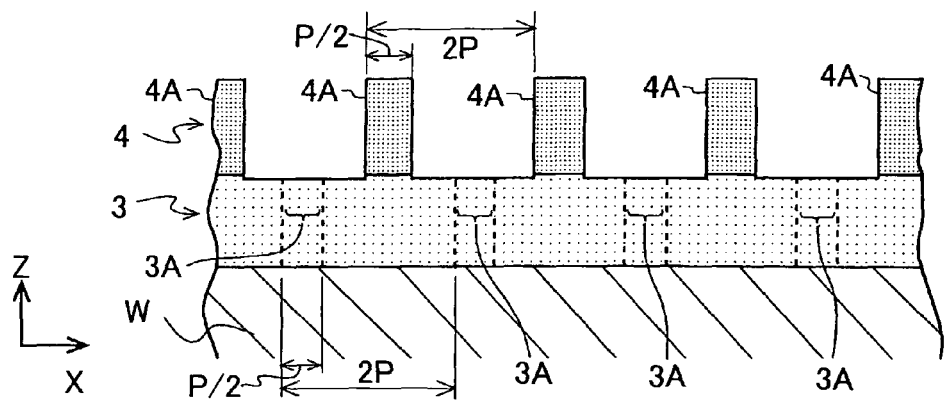
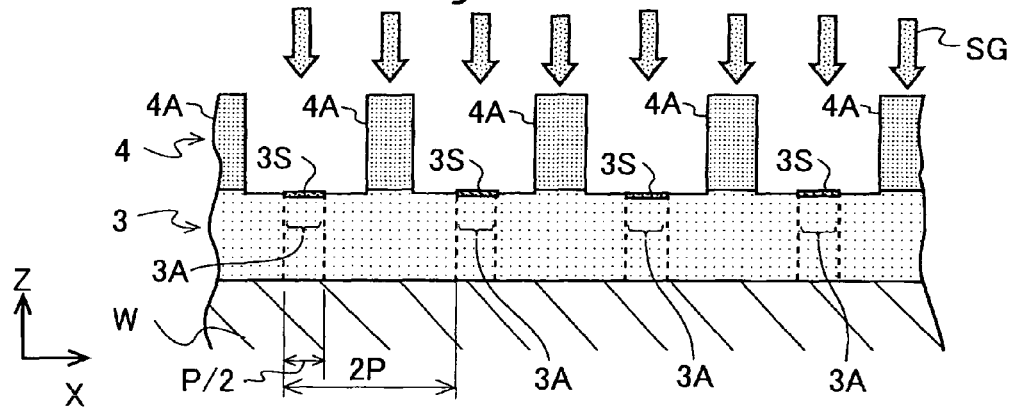
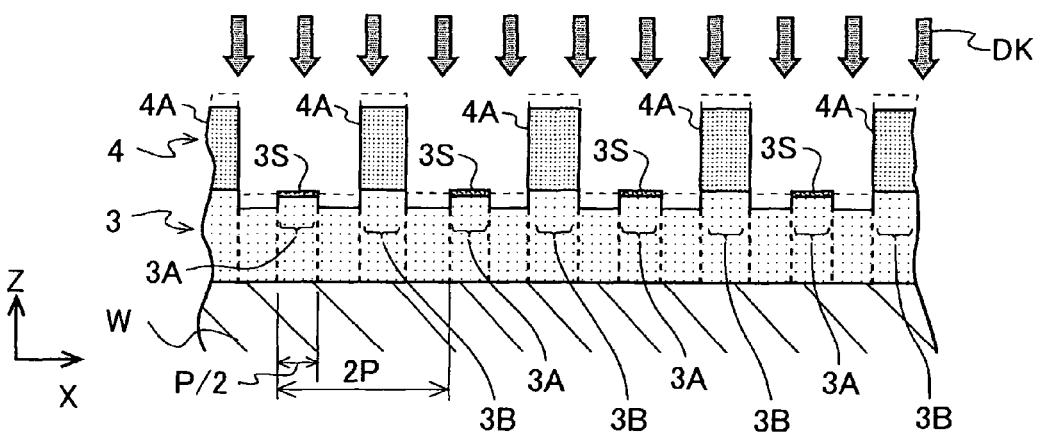

PATTERN FORMING METHOD AND DEVICE PRODUCTION METHOD

CROSS-REFERENCES TO RELATED APPLICATIONS

This application claims the benefit of priority of U.S. Provisional Application No. 61/136,511 filed on Sep. 11, 2008 and U.S. Provisional Application No. 61/136,512 filed on Sep. 11, 2008, the entire disclosures of which are incorporated herein by reference.

BACKGROUND OF THE INVENTION

1. Field of the Invention

The present invention relates to a pattern forming method for forming a pattern on an object, and a device production method. The present invention is applicable, for example, when a fine pattern, which is finer than the resolution limit of an exposure apparatus, is formed.

2. Description of the Related Art

When a device such as a semiconductor element or the like (electronic device, microdevice) is produced, a device production process is used, which includes repeating a thin film formation process for forming a thin film on a substrate such as a wafer, a glass substrate or the like, a lithography process for forming a resist pattern (pattern of a photosensitive material) on the substrate or the thin film, and a processing process for processing the substrate or the thin film by using the resist pattern as a mask. In this specification, the lithography process (lithography step) means a process which includes a coating step of coating the substrate with the resist (photoresist), an exposure step of exposing the resist via a mask pattern by using an exposure apparatus, and a development step of developing the resist after the exposure.

In response to the progress of the fine pattern of the semiconductor element or the like, those having been performed, in order to enhance the resolving power, with respect to the exposure apparatus to be used in the lithography process include, for example, the progress of the short wavelength for the exposure wavelength, the increase in the numerical aperture NA of the projection optical system, the optimization of the illumination condition including the so-called modified illumination, etc. and the development of the mask technique including the phase shift reticle, etc. Recently, an exposure apparatus, which uses the liquid immersion method, has been also developed in order to further increase the numerical aperture NA substantially while securing broad depth of focus. Recently, the so-called double process system is also suggested, in which the lithography process is repeated twice to thereby form a fine circuit pattern that exceeds the resolution limit of the exposure apparatus (see, for example, Japanese Patent Application Laid-open No. 2007-311508).

In the conventional pattern forming method of the double process system, it is necessary that the overlay exposure is performed in a second lithography process to be carried out a second time. Therefore, a problem arises such that the shape accuracy of the fine pattern to be finally formed depends also on the alignment accuracy of the exposure apparatus.

SUMMARY OF THE INVENTION

Taking the foregoing circumstances into consideration, an object of the present invention is to provide a pattern formation technique and a device production technique which make it possible to form a fine pattern exceeding the resolution limit of the exposure apparatus by using the lithography process without performing the overlay exposure.

According to a first aspect of the present invention, there is provided a pattern forming method for forming a pattern on an object, the method comprising: forming, on the object, first and second photosensitive layers having different photosensitive characteristics; exposing the first and second photosensitive layers via a pattern; and developing the first and second photosensitive layers.

According to a second aspect of the present invention, there is provided a pattern forming method for forming a pattern on an object, the method comprising: forming a first photosensitive layer, an intermediate layer, and a second photosensitive layer on the object; exposing the first photosensitive layer, the intermediate layer, and the second photosensitive layer via a pattern; and developing the first photosensitive layer, the intermediate layer, and the second photosensitive layer.

According to a third aspect of the present invention, there is provided a pattern forming method comprising: forming a photosensitive lower layer on a substrate; forming a photosensitive upper layer on the lower layer; irradiating a light onto the upper layer formed on the lower layer via a predetermined pattern to simultaneously expose the upper layer and the lower layer with the light; developing the exposed upper layer such that a first area corresponding to the predetermined pattern remains in the upper layer; developing the exposed lower layer by using the first area of the upper layer as a mask such that a second area corresponding to the predetermined pattern and a masked area positioned under the first area of the upper layer remain in the lower layer; and developing the substrate by using the second area and the masked area of the lower layer as masks to thereby form, on the substrate, a pattern corresponding to the second area and the masked area.

According to a fourth aspect of the present invention, there is provided a method for producing a device, comprising: forming a pattern of a photosensitive layer on a substrate by using the pattern forming method of the present invention; and processing the substrate on which the pattern is formed.

According to the pattern forming method of the present invention, the pattern formed of the photosensitive layer, which is finer than the pattern subjected to the exposure, is obtained after the development. Therefore, a fine pattern, which exceeds the resolution limit of the exposure apparatus, can be formed by using the lithography process without performing the overlay exposure.

BRIEF DESCRIPTION OF THE DRAWINGS

FIGS. 5A to 5C are magnified sectional views illustrating the change of the pattern on the wafer in the first embodiment, wherein FIG. 5A shows a resist pattern allowed to remain on the wafer after the development, FIG. 5B shows a resist pattern after the exfoliation of the positive resist, and FIG. 5C shows an L & S pattern formed on the wafer.

FIGS. 10A to 10C are magnified sectional views each illustrating the change of the states of the two resist layers on the wafer, continued to the states shown in FIG. 9 (9A to 9C).

FIGS. 11A to 11C are magnified sectional views each illustrating the change of the pattern on the wafer in the fourth embodiment, wherein FIG. 11A shows a resist pattern during a dry development, FIG. 11B shows a resist pattern after the dry development, and FIG. 11C shows an L & S pattern formed on the wafer.

DESCRIPTION OF THE PREFERRED EMBODIMENTS

First Embodiment

An explanation will be made with reference to FIGS. 1 to 6 about a first preferred embodiment of the present invention.

Figure 1A:
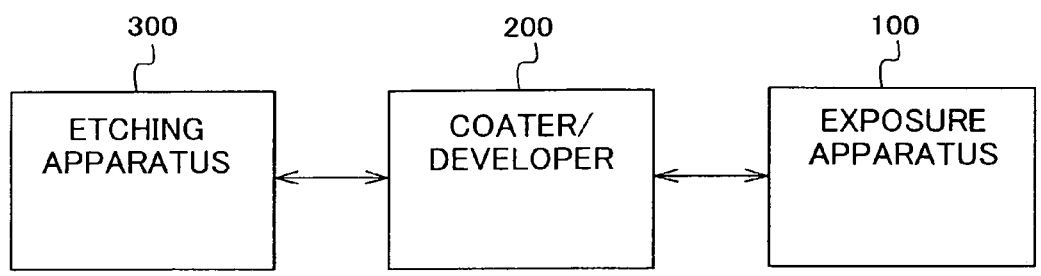
FIG. 1A is a block diagram of main components of a pattern forming system used in an embodiment of the present invention.
Figure 1B:
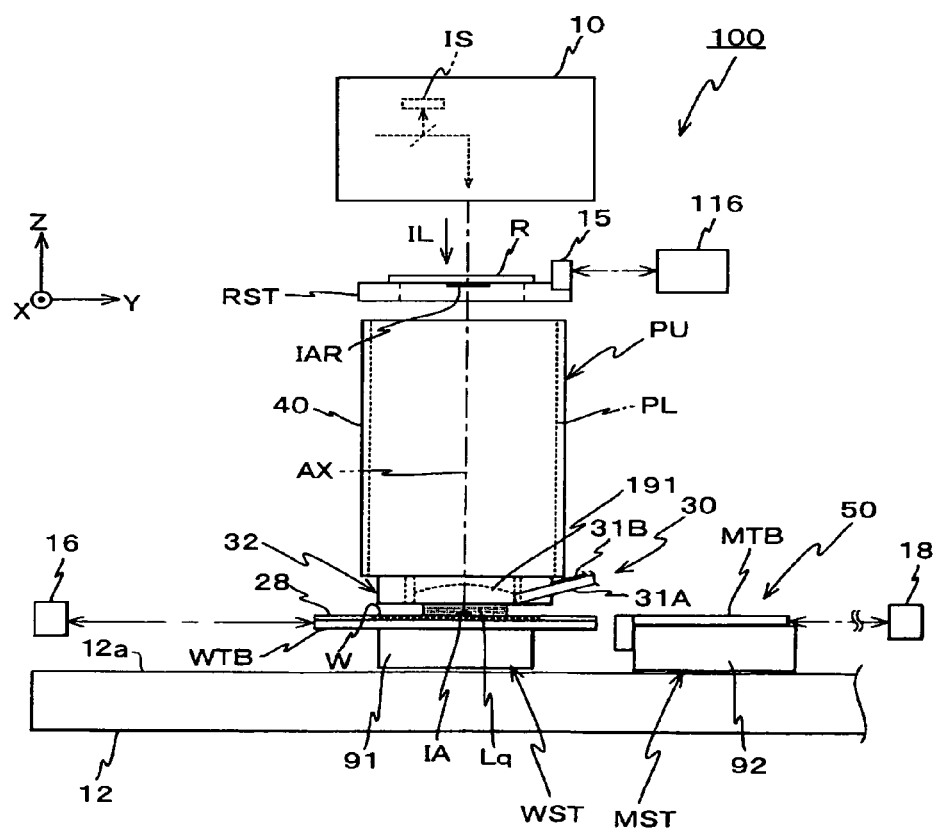
FIG. 1B shows a schematic construction of an exposure apparatus used in the embodiment.

FIG. 1A is a block diagram of main components of a pattern forming system of this embodiment. FIG. 1B is a schematic construction of an exposure apparatus 100 of the so-called scanning stepper type (projection exposure apparatus of the scanning type) used in the lithography process of this embodiment. With reference to FIG. 1A, the pattern forming system includes the exposure apparatus 100, a coater/developer 200 which performs the coating and the development of a resist (photoresist) for a wafer, an etching apparatus 300 which forms a pattern on the wafer, a thin film forming apparatus (not shown), a transport mechanism (not shown) which transports the wafer among the apparatuses, and the like.

With reference to FIG. 1B, the exposure apparatus 100 includes an illumination system 10, a reticle stage RST which holds a reticle R illuminated with an illumination light or illumination light beam (exposure light or exposure light beam) IL for the exposure from the illumination system 10, a projection unit PU which includes a projection optical system PL projecting the illumination light IL exiting from the reticle R onto a wafer W, and a stage device 50 which has a wafer stage WST holding the wafer W and a measuring stage MST. The exposure apparatus 100 also includes a control system including a main controller 20 shown in FIG. 3 constructed of a computer integrally controlling the operation of the entire apparatus. The following explanation will be made assuming that the Z axis extends in parallel to an optical axis AX of the projection optical system PL of the exposure apparatus 100, the Y axis extends in a direction in which the reticle and the wafer are scanned relative to each other in a plane perpendicular to the Z axis, and the X axis extends in a direction which is perpendicular to the Z axis and the Y axis, wherein directions of rotation (inclination) about the X axis, the Y axis, and the Z axis are designated as θx, θy, and θz directions respectively.

The illumination system 10 includes a light source and an illumination optical system as disclosed, for example, in Japanese Patent Application Laid-open No. 2001-313250 (corresponding to United States Patent Application Publication No. 2003/0025890). The illumination optical system has, for example, an illuminance-uniformalizing optical system including an optical integrator (a fly's eye lens, a rod integrator (internal reflection type integrator), a diffraction optical element, etc.), a reticle blind, etc. (any one of these components is not shown). The illumination system 10 illuminates a slit-shaped illumination area IAR on the reticle R, defined by the reticle blind, with the illumination light IL at an approximately uniform illuminance.

As an example, the ArF excimer laser beam (wavelength: 193 nm) is used as the illumination light IL. Those also usable as the illumination light include, for example, the KrF excimer laser beam (wavelength: 248 nm), the high harmonic wave of the YAG laser or the solid laser (the semiconductor laser, etc.), and the emission line of the mercury lamp (the i-ray, etc.).

The illumination system 10 is also provided with an integrator sensor IS which measures the light amount of a light flux branched from the illumination light in order to measure an exposure amount with respect to the wafer W during the exposure. The relationship between a measured value of the integrator sensor IS and illuminance (pulse energy) of the illumination light on the wafer W is previously measured, and is stored in a storage section (memory) included in an exposure amount control system 130 shown in FIG. 3. The exposure amount control system 130 controls the pulse energy of the illumination light, etc. based on the measured value of the integrator sensor IS so that a totalized exposure amount for the respective points on the wafer W is the exposure amount set by the main controller 20 during the exposure.

The reticle R, which has, for example, a circuit pattern formed on a pattern surface (lower surface) thereof, is held on the reticle stage RST shown in FIG. 1B by, for example, the vacuum attraction. The reticle stage RST can be finely driven in the XY plane by a reticle stage driving system 11 shown in FIG. 3 including a linear motor, etc., and it can be driven at a designated scanning velocity in the scanning direction (Y direction).

The position information about the reticle stage RST shown in FIG. 1B (including the positions in the X direction and the Y direction and the angle of rotation in the θz direction) is always detected at a resolution of, for example, about 0.5 to 0.1 nm by a reticle interferometer 116 constructed of a laser interferometer, via a movement mirror 15 (or a reflecting surface provided by mirror-finishing an end surface of the stage). A measured value obtained by the reticle interferometer 116 is fed to the main controller 20 shown in FIG. 3. The main controller 20 controls the reticle stage driving system 11 based on the measured value to thereby control the position and the velocity of the reticle stage RST.

The projection unit PU, which is arranged under or below the reticle stage RST, includes a barrel 40, and a projection optical system PL having a plurality of optical elements which are held in a predetermined positional relationship in the barrel 40. The projection optical system PL is, for example, telecentric on the both sides, and has a predetermined projection magnification β (for example, a reduction magnification of ¼-fold, ⅕-fold, etc.). When the illumination area IAR of the reticle R is illuminated with the illumination light IL from the illumination system 10, an image of the circuit pattern of the reticle R in the illumination area IAR is formed, via the projection optical system PL, in the exposure area IA (area conjugate with the illumination area IAR) on one shot area of the wafer W by the illumination light IL passing through the reticle R. The wafer W of this embodiment has a thin film for pattern formation (a metal film, a polysilicon film, etc.) which is formed on a surface of a disk-shaped semiconductor wafer having a diameter of, for example, 200 mm to 300 mm. Further, on the surface of the wafer W as the exposure objective, a plurality of types of resists (photoresists) are coated as photosensitive layers (photosensitive materials) with predetermined thicknesses (for example, about 40 nm to 200 nm) respectively, as described later on.

In order to perform the exposure to which the liquid immersion method is applied, the exposure apparatus 100 is provided with a nozzle unit 32 which constructs a part of a local liquid immersion device 30 so that the nozzle unit 32 surrounds the surroundings of the lower end portion of the barrel 40 holding a forward end lens (end lens) 191 which is an optical constructing the projection optical system PL and which is disposed closest to a side of the image plane (closest to a side of the wafer W).

Figure 3:
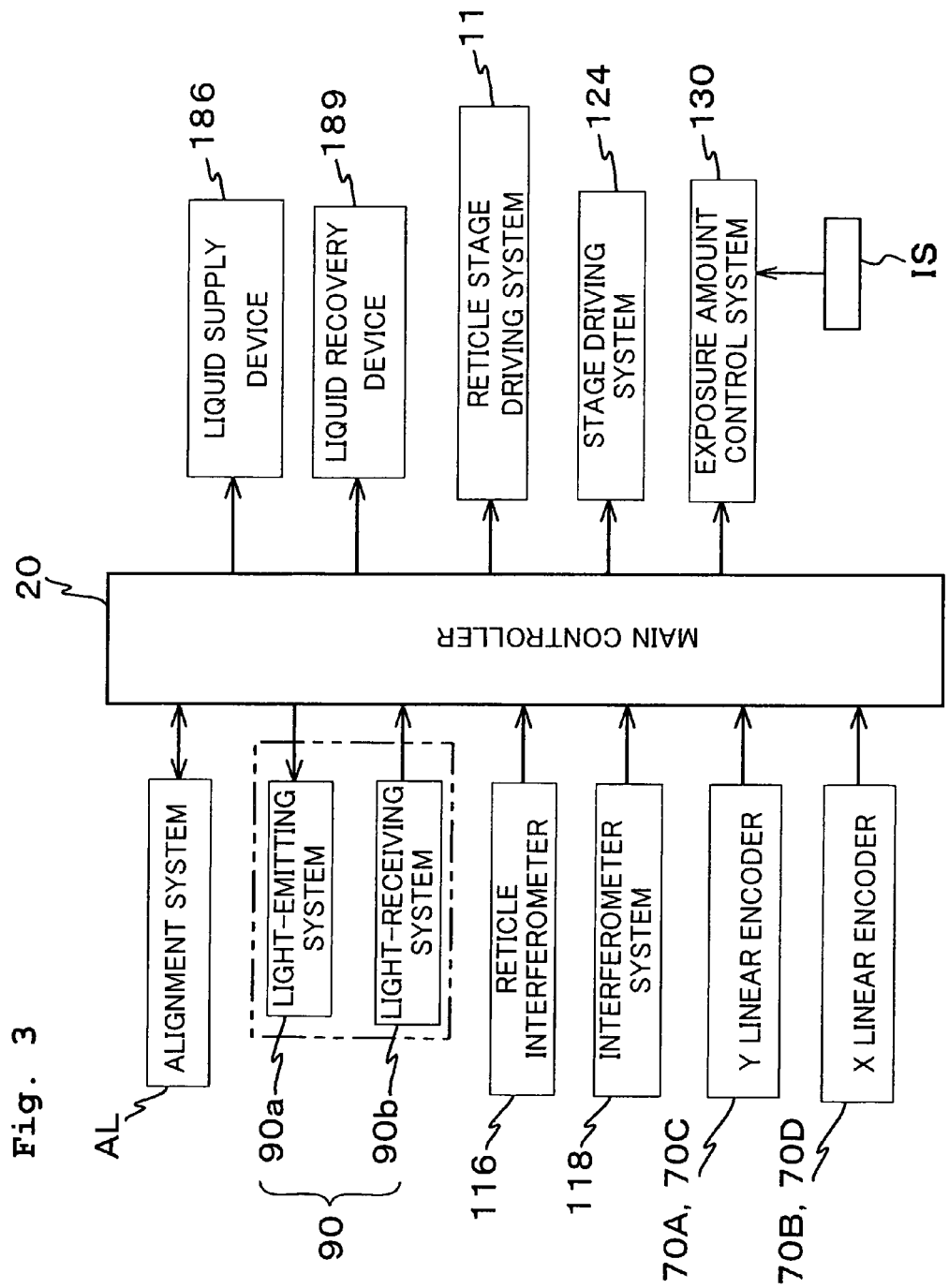
FIG. 3 is a block diagram of a control system of the exposure apparatus shown in FIG. 1B.

With reference to FIG. 1B, the nozzle unit 32 has a supply port which is capable of supplying a liquid Lq for the exposure and a recovery port in which a porous member (mesh) capable of recovering the liquid Lq is arranged. The supply port of the nozzle unit 32 is connected, via a supply flow passage and a supply tube 31A, to a liquid supply device 186 which is shown in FIG. 3 and which is capable of feeding the liquid Lq. The recovery port of the nozzle unit 32 is connected, via a recovery flow passage and a recovery tube 31B, to a liquid recovery device 189 shown in FIG. 3.

When the wafer W is exposed with the liquid immersion method, the liquid Lq for the exposure, fed from the liquid supply device 186, flows through the supply tube 31A and the supply flow passage of the nozzle unit 32, and then the liquid Lq is supplied from the supply port of the nozzle unit 32 to the liquid immersion area on the wafer W including the optical path space for the illumination light IL. The liquid Lq, which is recovered from the liquid immersion area via the recovery port of the nozzle unit 32, is recovered by the liquid recovery device 189 via the recovery flow passage and the recovery tube 31B. The liquid immersion area, which is formed on the wafer W, is formed only on a part of the area (a partial area) of the wafer W, i.e., locally on the wafer W, but not on the entire wafer W. In this meaning, the local liquid immersion exposure apparatus or method is distinguished from a liquid immersion exposure apparatus or method of a type in which the entire wafer is immersed in a liquid filled in a vessel or a pool.

Those usable as the nozzle unit 32 also include, for example, a nozzle unit including a first nozzle member which supplies and recovers the liquid disposed at the central portion and a second nozzle member which recovers the liquid disposed at the outside of the central portion, as disclosed, for example, in International Publication No. 2005/122218 (corresponding to United States Patent Application Publication No. 2007/0291239).

With reference to FIG. 1B, the wafer stage WST and the measuring stage MST of the stage device 50 are supported in a non-contact manner, for example, via a plurality of unillustrated vacuum pre-loadable pneumatic static pressure bearings respectively on an upper surface 12a, parallel to the XY plane, of a base plate 12 with a clearance of about several μm intervening therebetween. The stage device 50 further includes an interferometer system 118 (see FIG. 3) including Y axis interferometers 16, 18 and X axis interferometers (not shown) which measure the position information about the stages WST, MST; an encoder system which measures the position information about the wafer stage WST during the exposure, etc. as described later on; a stage driving system 124 (see FIG. 3) including, for example, a plurality of sets of linear motors (or planar motors) which drive the stages WST, MST independently in the X direction and the Y direction; and the like.

The wafer stage WST includes a body 91 of the stage (stage body 91), a wafer table WTB which is provided on the stage body 91, and a Z leveling mechanism which is provided in the stage body 91 and which finely drives the position in the Z direction and the tilt angles in the θx direction and the θy direction of the wafer table WTB (wafer W) relative to the stage body 91. Further, an autofocus sensor (hereinafter referred to as "AF system") 90 (see FIG. 3) of the oblique incidence system, which includes a light-emitting system 90a and a light-receiving system 90b and which is constructed in the same manner as those disclosed, for example, in Japanese Patent Application Laid-open No. 6-283403 (corresponding to U.S. Pat. No. 5,448,332), etc., is provided to measure the positions in the Z direction of a plurality of points on the wafer W. The main controller 20 drives the Z leveling mechanism so that the surface of the wafer W is focused on the image plane of the projection system PL based on a measured value of the AF system 90 during the exposure.

Figure 2:
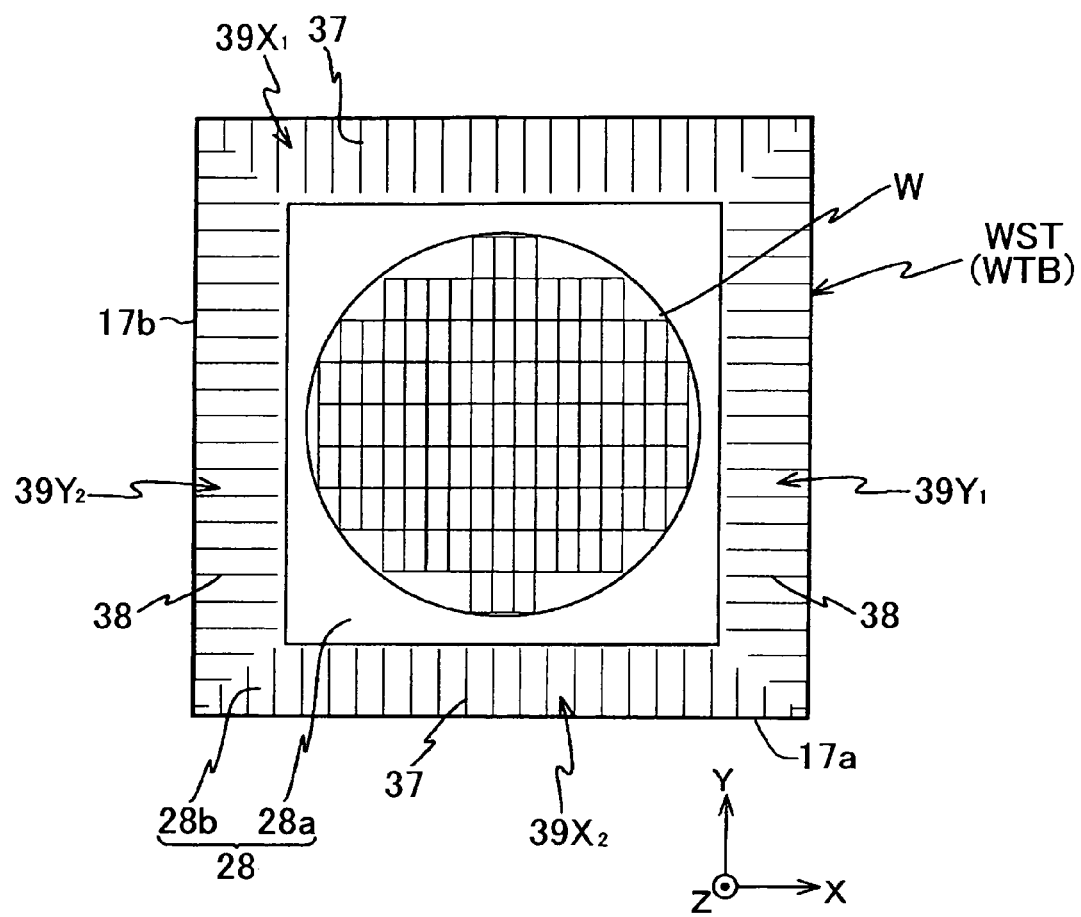
FIG. 2 is a plan view of a wafer stage WST shown in FIG. 1B.

As shown in FIG. 2 which is a plan view of the wafer stage WST, reflecting surfaces 17a, 17b are formed by the mirror-finishing processing on end surfaces in the Y direction and the X direction, respectively, of the wafer table WTB. The Y axis interferometer 16 and the X axis interferometer (not shown) of the interferometer system 118 radiate interferometer beams onto the reflecting surfaces 17a, 17b (or may be movement mirrors) respectively to measure the positions of the respective reflecting surfaces as well as the position information about the wafer stage WST (including, for example, at least the positions in the X direction and the Y direction and the angle of rotation in the θz direction) at a resolution of, for example, about 0.5 to 0.1 nm; and obtained measured values are supplied to the main controller 20.

A wafer holder (not shown), which holds the wafer W for example by the vacuum attraction, etc. on a suction surface approximately parallel to the XY plane, is provided on the wafer table WTB. A flat plate-shaped plate (liquid-repellent plate) 28, having a surface which is provided to be approximately flush with the surface of the wafer (wafer surface) and which is subjected to the liquid-repellent treatment for the liquid Lq, is provided around the wafer holder (wafer W) on the upper surface of the wafer table WTB. As shown in FIG. 2, the plate 28 has a first area 28a which surrounds the wafer W, and a rectangular frame-shaped (annular) second area 28b which is arranged around the first area 28a.

Y scales $39Y_1$, $39Y_2$ are formed in the second area 28b at areas disposed on the both sides in the X direction of the second area 28b. X scales $39X_1$, $39X_2$ are formed in the second area 28b at areas disposed on the both sides in the Y direction of the second area 28b. The Y scales $39Y_1$, $39Y_2$ and the X scales $39X_1$, $39X_2$ are reflection type gratings (for example, phase type diffraction gratings) having the periodic directions in the Y direction and the X direction, wherein grating lines 38, 37, which have the longitudinal directions in the X direction and the Y direction respectively, are formed at predetermined pitches (for example, 100 nm to 4 μm) in the Y direction and the X direction respectively.

In this embodiment, there are provided Y linear encoders 70A, 70C shown in FIG. 3 which are constructed of a plurality of Y axis encoders and which detect the gratings of the Y scales $39Y_1$, $39Y_2$ at a resolution of, for example, 0.5 to 0.1 nm; and X linear encoders 70B, 70B shown in FIG. 3 which detect the gratings of the gratings of the X scales $39X_1$, $39X_2$. In this embodiment, the position information in the XY plane about the wafer stage WST (wafer table WTB) is mainly measured by the Y linear encoders 70A, 70C and the X linear encoders 70B, 70D (encoder system) described above. The measured value obtained by the interferometer system 118 is auxiliarily used, for example, when the long term fluctuation of the measured value of the encoder system (for example, fluctuation caused, for example, by the time-dependent deformation of the scale) is corrected (calibrated). Further, the measured information obtained by the interferometer system 118 is also used to measure, for example, the position in the Y direction of the wafer table WTB in the vicinity of an unloading position and a loading position as described later on, for example, in order to exchange the wafer.

With reference to FIG. 1B, the measuring stage MST is constructed such that a flat plate-shaped measuring table MTB, etc. is provided on a stage body 92. Various measuring instruments (not shown), which include a radiation amount monitor, an uneven illuminance sensor, etc. are provided for the measuring table MTB and the stage body 92. Reflecting surfaces are also formed on end surfaces in the +Y direction and the −X direction of the measuring table MTB of the measuring stage MST. The Y axis interferometer 18 and the X axis interferometer (not shown) of the interferometer system 118 radiate the interferometer beams (length-measuring beams) onto the reflecting surfaces to measure the position information about the measuring stage MST (including, for example, at least the positions in the X direction and the Y direction and the angle of rotation in the θz direction).

The main controller 20 controls the positions and the velocities of the wafer stage WST and the measuring stage MST via the stage driving system 124 based on the obtained measured values.

Although not shown in FIG. 1B, the exposure apparatus 100 of this embodiment is provided with an alignment system AL (see FIG. 3) which measure the position of the predetermined alignment mark disposed on the wafer W, and a spatial image-measuring system (not shown) at least a portion or part of which is provided on the wafer stage WST in order to measure the position of an image of the alignment mark of the reticle R provided by the projection optical system PL. The alignment is performed for the reticle R and each of the shot areas of the wafer W by using the spatial image-measuring system and the alignment system AL.

Upon exposing the wafer W, the liquid Lq is supplied from the local liquid immersion device 30 to a space between the projection optical system PL and the wafer W, and a part of the image of the pattern of the reticle R is projected onto one (certain) shot area on the wafer W via the projection optical system PL. In this state, the reticle R is moved in the Y direction via the reticle stage RST, in synchronization with which the wafer W is moved in a direction corresponding to the Y direction via the wafer stage WST. With this, the certain shot area is subjected to the scanning exposure with the image of the pattern of the reticle R. After that, the wafer W is step-moved in the X direction and the Y direction via the wafer stage WST so that the next shot area on the wafer W is moved to a position disposed in front of the exposure area. The step movement and the scanning exposure are repeated, and thus each of the shot areas on the wafer W is exposed with the image of the pattern of the reticle R in the step-and-scan manner and the liquid immersion manner.

An explanation will be made below with reference to a flow chart shown in FIG. 6 about an example of the pattern formation process using the pattern forming system of this embodiment. In this case, for example, it is assumed that a line-and-space pattern (hereinafter referred to as "L & S pattern") having a period (pitch) P is formed on the wafer W. The period P has a value which exceeds the resolution limit of the exposure apparatus 100 shown in FIG. 1B, for example, a value which is about ½ of the resolution limit. Assuming that the period of the image of the L & S pattern at the resolution limit of the exposure apparatus 100 is, for example, 80 nm, the period of the L & S pattern formed on the wafer W is 40 nm.

In this case, an L & S pattern (or may be a phase shift pattern or the like), in which the period in the X direction of the image brought about by the projection optical system PL of the exposure apparatus 100 is 2P, is formed in the pattern area of the reticle R shown in FIG. 1B.

FIGS. 4A to 4C and FIGS. 5A to 5C show magnified sectional views each illustrating a part of the surface of the wafer W during a series of steps of the pattern formation. It is assumed that the X direction extends in the periodic direction of the L & S pattern formed on the wafer W, and the Z direction extends in the normal line direction of the surface of the wafer W.

Figure 4A:
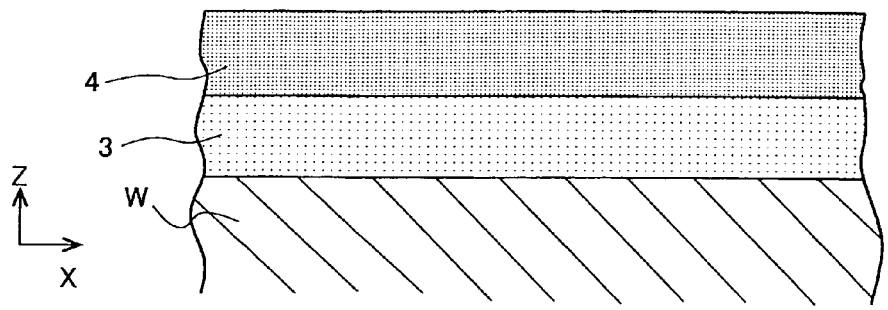
FIGS. 4A to 4C are magnified sectional views each illustrating a part of a surface of the wafer, depicting the change of the states of two layers of resists (two resist layers) coated on the wafer.

At first, a thin film for forming the pattern is formed on the surface of the wafer W made of the semiconductor wafer by using a thin film-forming apparatus (not shown in the drawings). The drawings attached to this specification show, as the wafer W, a wafer on which such a thin film has been formed beforehand. Subsequently, the wafer W is transported to the coater/developer 200 shown in FIG. 1A. As shown in FIG. 4A, on the surface of the wafer W, a negative resist 3 having a low sensitivity (requiring a large exposure amount) is coated as a lower layer with a thickness of about 40 to 200 nm (see Step 101 shown in FIG. 6). Subsequently in Step 102, on the negative resist 3 of the wafer W, a positive resist 4 having a high sensitivity (requiring a small exposure amount) is coated as an upper layer with a thickness of about 40 to 200 nm. The sensitivities of the negative resist 3 and the positive resist 4 will be described later on. The information about the sensitivities of the resists is stored in a storage device included in the main controller 20. It is allowable that, as necessary, the wafer W may be pre-baked after the negative resist 3 is coated on the wafer W and/or after the positive resist 4 is further coated on the negative resist 3. Alternatively, it is allowable that the thin film-forming apparatus is provided on the coater/developer 200 so as to form the thin film in the coater/developer 200.

Figure 4B:
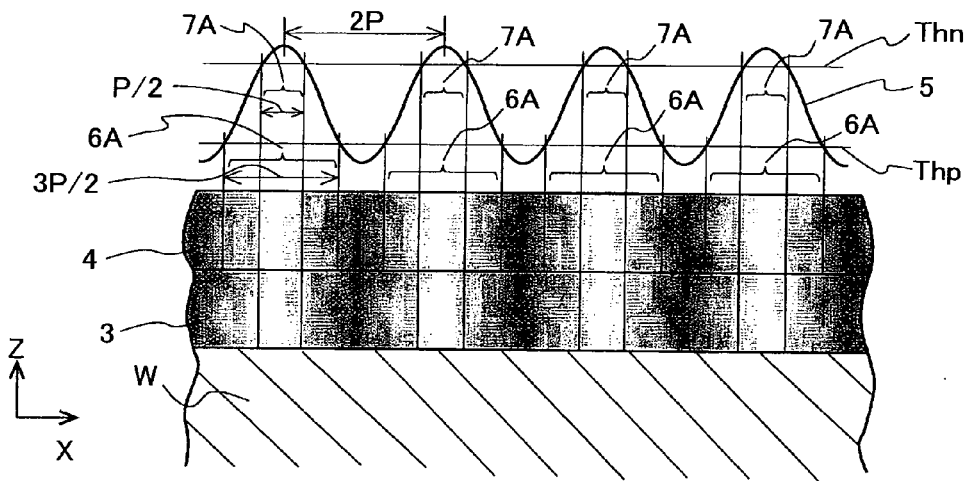

Subsequently in Step 103, the wafer W on which the two layers of resists (two resist layers) are coated is transported onto the wafer stage WST of the exposure apparatus 100 shown in FIG. 1B, and the respective shot areas of the wafer W are exposed with the image of the L & S pattern of the reticle R via the projection optical system PL. As a result, as shown in FIG. 4B, in each of the shot areas on the wafer W, the negative resist 3 and the positive resist 4 are exposed with the image of the L & S pattern having the period (pitch) 2P in the X direction as represented, for example, by a sine wave-shaped light amount distribution curve 5.

In this case, a photosensitive level (threshold value) Thp of the positive resist 4 having the high sensitivity is set so that areas 6A, each of which has a width in the X direction of about 3P/2 with a position of the maximum light amount in relation to the light amount distribution curve 5 as the center, is at not less than the photosensitive level Thp. Therefore, the areas 6A periodically appear at the period of 2P in the X direction. The area 6A corresponds to an exposed portion (portion which is removed by the development) of the positive resist 4; and the width ratio in the X direction between the exposed portion and the unexposed portion is about 3:1. On the other hand, a photosensitive level (threshold value) Thn of the negative resist 3 having the low sensitivity is set so that areas 7A, each of which has a width in the X direction of about P/2 with a position of the maximum light amount in relation to the light amount distribution curve 5 as the center, is at not less than the photosensitive level Thn. Therefore, the areas 7A periodically appear at the period of 2P in the X direction. The area 7A corresponds to an exposed portion 3A (portion which is allowed to remain after the development) of the negative resist 3 shown in FIG. 4C; and the width ratio between the exposed portion and the unexposed portion is about 1:3. Each of the areas 7A is positioned at the center of one of the areas 6A.

Under this condition, the sensitivity of the positive resist 4 is higher than that in a case where the width ratio between the exposed portion and the unexposed portion is 1:1, and the sensitivity of the negative resist 3 is lower than that in a case where the width ratio between the exposed portion and the unexposed portion is 1:1.

In this embodiment, it is assumed that the light amount distribution curve 5 is a sine wave in relation to the position X, the minimum value of the light amount distribution curve 5 is zero (0), and the maximum value (preset exposure amount to be brought about by the exposure apparatus) is EP. On this assumption, the photosensitive levels Thp, Thn are approximately as follows.

$$Thp = (2 - 2^{1/2})EP/4 \quad (1)$$

$$Thn = (2 - 2^{1/2})EP/4 \quad (2)$$

$$Thn/Thp = (2 + 2^{1/2})/(2 - 2^{1/2}) \approx 5.83 \quad (3)$$

Therefore, it is appropriate that the photosensitive level Thn of the negative resist 3 having the low sensitivity is set to be approximately six times the photosensitive level Thp of the positive resist 4 having the high sensitivity. In this case, when the actual exposure amount EP is determined for example such that the width of the exposed area 7A is P/2, then the width of the exposed area 6A is approximately 3P/2. Actually, the photosensitive levels Thn, Thp can be determined depending on the development characteristic, the shape of the light amount distribution curve 5, etc.

Figure 4C:
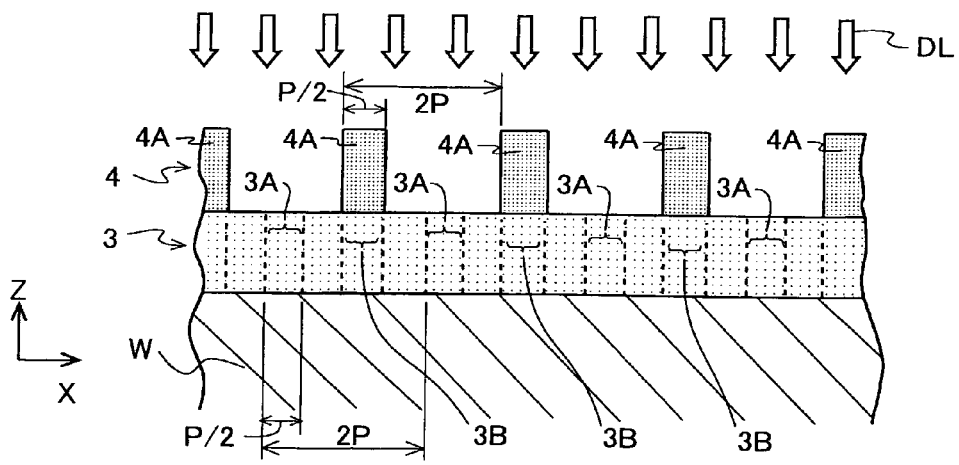

Subsequently, in Step 104, the wafer W after the exposure (exposed wafer W) is transported from the exposure apparatus 100 to the coater/developer 200 shown in FIG. 1A to perform PEB (post-exposure bake) as the baking before the development for the wafer W in order to reduce the standing wave effect, if necessary. After that, the negative resist 3 and the positive resist 4 on the wafer W are developed in the Z direction which is the normal line direction of the surface of the wafer W. This development can be referred to as "anisotropic development". For this purpose, as shown in FIG. 4C, for example, a plasmic developing solution DL is blown against the wafer W in the Z direction for a predetermined period of time, as in a dry etching, from a nozzle (not shown) disposed over or above the wafer W. This development can be also referred to as "anisotropic dry development". In the former half of this development, the exposed portions of the positive resist 4, which correspond to the exposed areas 6A shown in FIG. 4B, are dissolved and removed, and the unexposed portions 4A each having the width P/2 are allowed to remain at the period 2P.

Figure 5A:
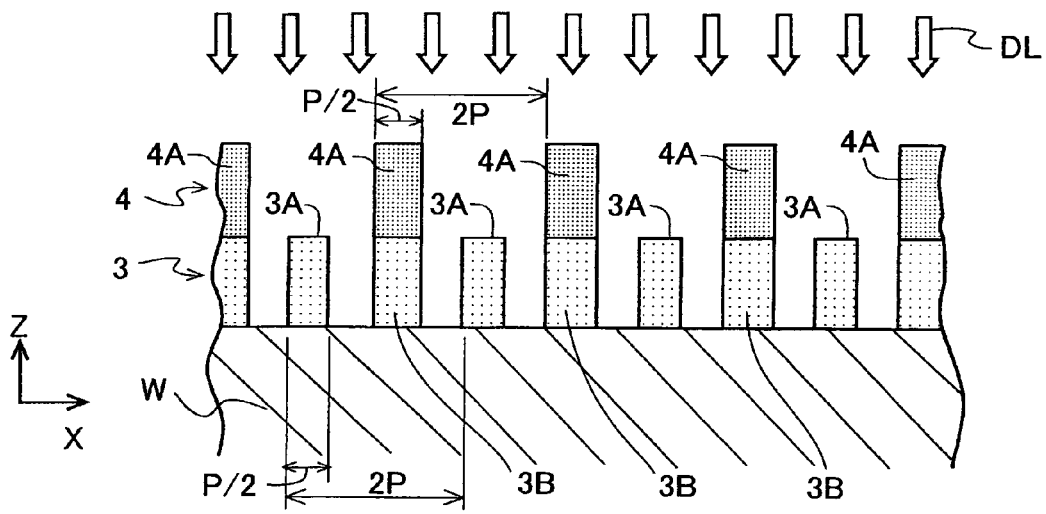

Until this stage, an ordinary development having no orientation may be performed, instead of the anisotropic dry development. However, if the ordinary development having no orientation is also continued thereafter, then areas 3B of the negative resist 3 (hereinafter referred to as "undeveloped portions"), each of which is disposed on the side of the bottom surface of one of the unexposed portions 4A of the positive resist 4, are also developed, and the unexposed portions 4A are removed as well. In order to avoid this situation (inconvenience), the development for the negative resist 3 is performed in the Z direction in this embodiment. Therefore, in the latter half of the development, as shown in FIG. 5A, the exposed portions 3A each having approximately the width of P/2 and the undeveloped portions 3B each having approximately the width of P/2 and covered with one of the unexposed portions 4A of the positive resist 4, the exposed portions 3A and the undeveloped portions 3B being included in the negative resist 3 on the wafer W, are allowed to remain. It can be stated that the undeveloped portion 3B of the negative resist 3 is an area masked by the unexposed portion 4A of the positive resist 4. Each of the exposed portions 3A and each of the undeveloped portions 3B have the period 2P in the X direction; and the undeveloped portions 3B are each positioned at the center between the exposed portions 3A.

Figure 5B:
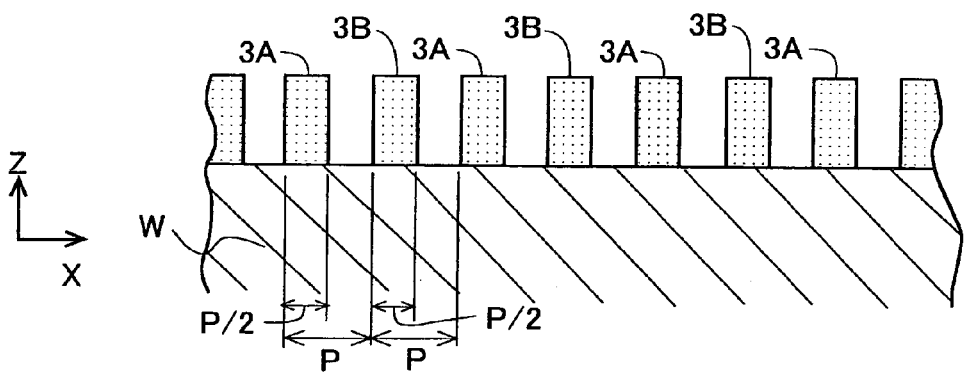
Figure 5C:
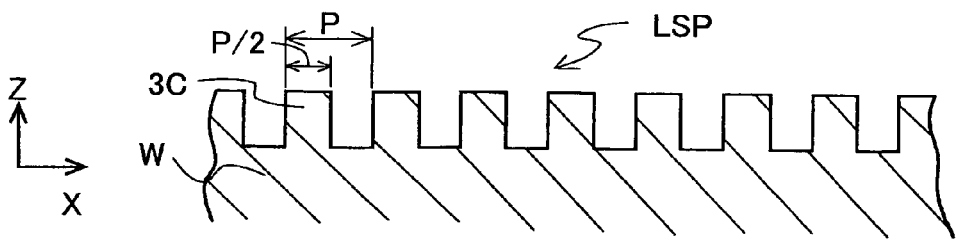

Subsequently in Step 105, when only a positive type resist pattern formed of the unexposed portions 4A of the positive resist 4 is exfoliated, when, for example, the positive type resist pattern is removed by ashing in or organic solvent or an oxygen plasma generated by high frequency discharge, then a negative type resist pattern, in which the exposed portions 3A and the undeveloped portions 3B having the widths P/2 are arranged in the X direction at the period P, are allowed to remain on the wafer W as shown in FIG. 5B. That is, a pattern, in which protrusions each having a width P/2 repeatedly appear at the period P, is formed on the wafer W. In Step 106 continued from the Step S105, in order to perform the pattern formation on the wafer W by using the resist pattern as the mask layer, the wafer W is transported to the etching apparatus 300 shown in FIG. 1A to perform the substrate processing including heating (curing), etching, etc. for the wafer W. Subsequently, in Step 107, the negative type resist pattern on the wafer W is exfoliated. Accordingly, as shown in FIG. 5C, an L & S pattern LSP, in which protruding line portions 3C each having approximately the width P/2 are arranged in the X direction at the period P, is formed on the thin film portion of the surface of the wafer W. Assuming that the period 2P of the image of the L & S pattern represented by the light amount distribution curve 5 shown in FIG. 4B is, for example, 80 nm, the period P of the L & S pattern LSP shown in FIG. 5C is 40 nm.

In this way, according to this embodiment, the fine L & S pattern LSP, which has the period P that is ½ of the resolution limit (period 2P) of the exposure apparatus 100, can be formed on the wafer W.

After that, in the next step of Step 108, as an example, the lithography process is repeated for the wafer W as necessary.

The function and the effect of this embodiment are, for example, as follows.

(1) In the pattern formation process of this embodiment, the resist pattern, which is approximately ½ of the resolution limit of the exposure apparatus 100, is formed on the wafer W by executing the lithography process (lithography step) once including Steps 101, 102 (coating step) of coating, on the surface of the wafer W, the negative resist 3 and the positive resist 4 having the different photosensitive characteristics; Step 103 (exposure step) of simultaneously exposing the negative resist 3 and the positive resist 4 on the wafer W with the image of the pattern of the reticle R by the exposure apparatus 100; and Step 104 (development step) of developing the negative resist 3 and the positive resist 4 on the wafer W in the Z direction. That is, the formation of the resist pattern of approximately ½ of the resolution limit is realized by performing the exposure only once.

Therefore, the fine pattern, which exceeds the resolution limit of the exposure apparatus, can be formed by using the lithography process without performing the overlay exposure.

(2) In Step 104, the negative resist 3 and the positive resist 4 are developed in the Z direction perpendicular to the surface of the wafer W. Therefore, as shown in FIG. 5A, it is possible to form the satisfactory resist pattern in which the contour of the cross-sectional shape is perpendicular to the surface of the wafer W.

However, it is enough that the contour of the cross section of the resist pattern is approximately perpendicular to the surface of the wafer W. Therefore, it is also enough that the direction of the development is approximately parallel to the Z direction. In particular, as the thicknesses of the negative resist 3 and the positive resist 4 are smaller, the allowance of the deviation of the development direction from the Z direction is more increased. Further, it is not necessarily indispensable that the developing solution DL is blown in parallel as a whole. The developing solution DL may be uniformly distributed approximately within a range of the allowance of the deviation of the development direction.

Further, the ordinary development having no orientation (for example, the wet development), which is to be reacted with only the positive resist 4, may be performed at the stage at which the development of the positive resist 4 is performed in the former half of Step 104. In this case, it is also allowable that the type of the developing solution differs between the development for the positive resist and the development for the negative resist 3 to be performed thereafter.

(3) In this embodiment, the anisotropic dry development, in which the plasmic developing solution is blown, is performed as the development in Step 104. In this case, among the portions physically collide with the developing solution (portions other than the undeveloped portions 3B shadowed by the unexposed portions 4A in relation to the negative resist 3), the portions which are removed are those having a chemical component which is dissolved and removed by the developing solution (portions other than the exposed portions 3A, i.e., the portions disposed between the exposed portions 3A and the undeveloped portions 3B in relation to the negative resist 3).

Alternatively, as for the anisotropic development, the developing solution may be in a state of high pressure steam or vapor, and may be jetted from a position disposed over or above the wafer (in the Z direction). In this procedure, only predetermined portions (portions between the exposed portions 3A and the undeveloped portions 3B in relation to the negative resist 3) are removed in accordance with the synergistic effect of the chemical reaction and the physical action.

When only the anisotropic development is performed in Step 104, the type of the developing solution may be also changed between the development for the positive resist 4 and the development for the negative resist 3.

(4) The first layer on the wafer W is the negative resist 3, and the second layer is the positive resist 4 having the sensitivity higher than that of the negative resist 3. In particular, in this embodiment, the photosensitive levels Thp, Thn of the positive resist 4 and the negative resist 3 are adjusted to be in the predetermined relationship. Therefore, as shown in FIG. 4C, the resist pattern, which has the period that is ½ of the period of the exposure pattern, can be formed after the anisotropic development.

In FIG. 4B, the decrease in the light amount (light amount distribution curve 5) of the illumination light (projected image) in the positive resist 4 is neglected. However, actually, the light amount of the projected image is decreased in the positive resist 4. Therefore, the sensitivity of the negative resist 3 can be set to be higher (photosensitive level Thn can be set to be lower) in some cases.

(5) The positive resist 4 may be coated as the first layer on the wafer W; the negative resist 3 may be coated as the second layer; and the sensitivity of the positive resist 4 may be set to be higher than that of the negative resist 3 (photosensitive level Thp may be set to be lower than the photosensitive level Thn). Even in the case of this construction, the resist pattern having the period P can be formed on the wafer W by performing the development in the Z direction.

(6) In the case of FIG. 4B, the sensitivity of the negative resist 3 is set to be low so that the ratio in the periodic direction (X direction) between the widths of the exposed portion 3A and the unexposed portion (dissolvable portion) is approximately 1:3; and the sensitivity of the positive resist 4 is set to be high so that the ratio in the X direction between the widths of the exposed portion (dissolvable portion) and the unexposed portion 4A is approximately 3:1. With this, it is possible to highly accurately form the fine resist pattern on the wafer W in which the period is ½ and the ratio between the widths of the protrusion and the recess is approximately 1:1 after the development.

Figure 6:
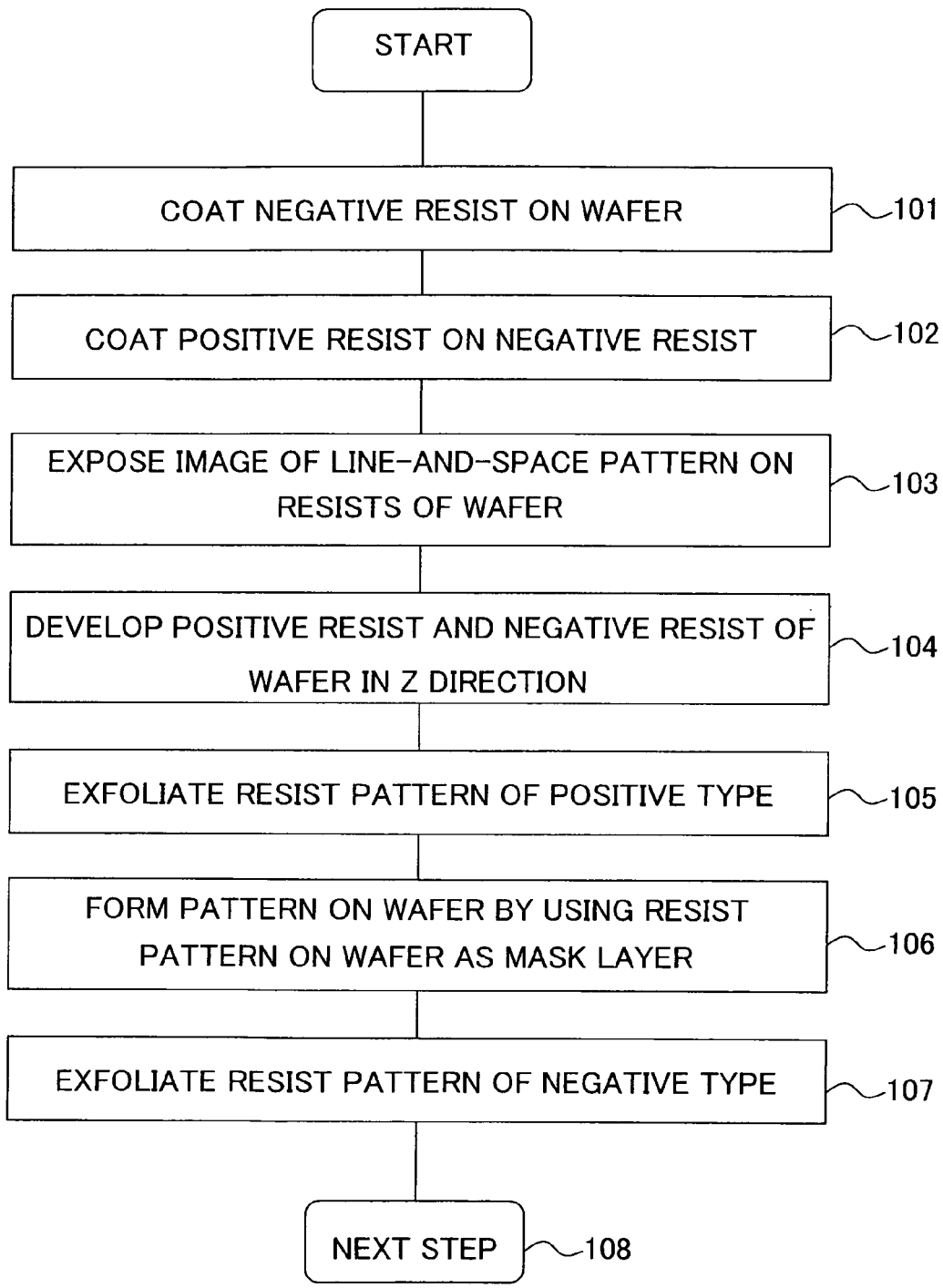
FIG. 6 shows a flow chart illustrating a pattern formation process of the first embodiment.

(7) For example, in a case that the negative resist 3 and the positive resist 4 are coated thinly, then Step 105 shown in FIG. 6 may be omitted, and the etching can be performed for the wafer W in a state that the unexposed portions 4A of the positive resist 4 remain as shown in FIG. 5A.

(8) In this embodiment, the wafer is exposed with the image of the one-dimensional L & S pattern. However, the wafer W may be exposed, for example, with an image of a two-dimensional L & S pattern having the periodicity in the X direction and the Y direction. In this case, a two-dimensional fine pattern can be finally formed on the wafer.

(9) The negative resist 3 and/or the positive resist 4 may be a multilayered resist film or multilayered resist films respectively.

Second Embodiment

Figure 7A:
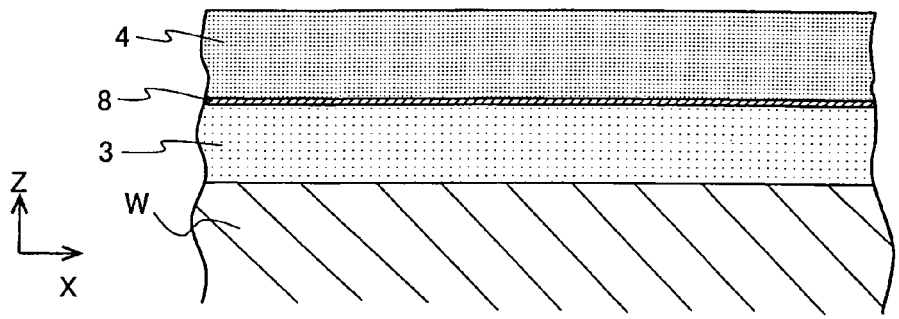
FIGS. 7A to 7C are magnified sectional views each illustrating a part of a surface of a wafer, depicting the change of the states of a light-dimming layer (dimming layer, light-shielding layer) and two resist layers which are coated on the wafer in a second embodiment of the present invention.

Next, a second embodiment of the present invention will be explained with reference to FIG. 7. Parts or components shown in FIGS. 7A to 7C, which correspond to those shown in FIGS. 4A to 4C and FIGS. 5A to 5C, are designated by the same reference numerals, any detailed explanation of which will be omitted. The pattern forming system shown in FIG. 1A is also used in this embodiment. However, a part of the method for forming the pattern on the wafer W is different from that shown in FIG. 6 as explained below.

That is, in this embodiment, a dimming layer (light-shielding layer) 8, which has a predetermined transmittance with respect to the illumination light IL of the exposure apparatus 100 shown in FIG. 1B, is formed on the negative resist 3 between Step 101 and Step 102 shown in FIG. 6. As a result, when the step corresponding to Step 102 is completed, the negative resist 3, the dimming layer 8, and the positive resist 4 are formed and stacked on the wafer W as shown in FIG. 7A. The dimming layer 8 is formed of a material which is removed (dissolved) by the developing solution for the positive resist 4 or the negative resist 3. The transmittance of the dimming layer 8 can be controlled by the thickness of the dimming layer 8. In view of this point, it can be stated that the dimming layer 8 is a photosensitivity-adjusting layer or an exposure amount-adjusting layer for the negative resist 3. As an example, the transmittance of the dimming layer 8 is set, for example, to about 1/6 (17%) so that the sensitivity of the positive resist 4 is equal to the sensitivity of the negative resist 3. Therefore, in this embodiment, the sensitivity (photosensitive level) of the negative resist 3 is equal to that of the positive resist 4.

Figure 7B:
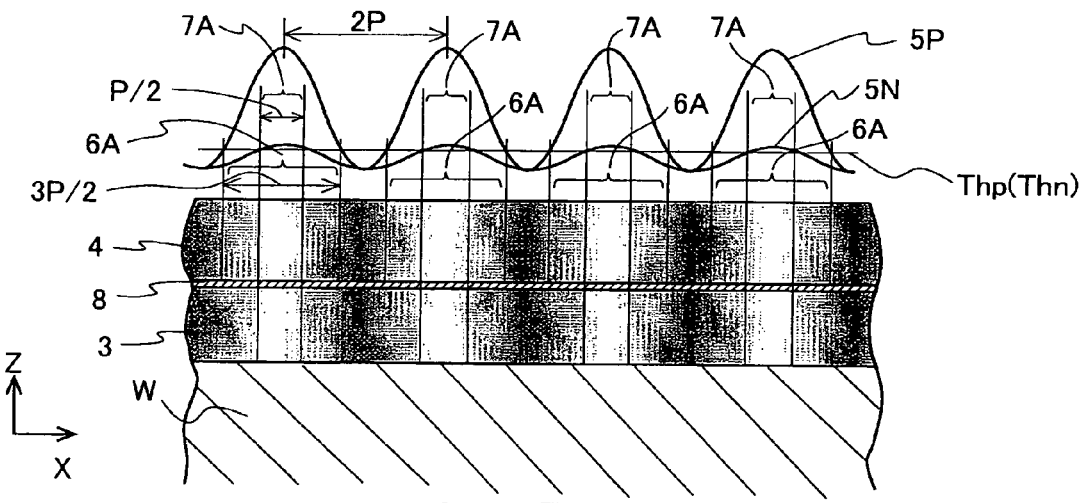
Figure 7C:
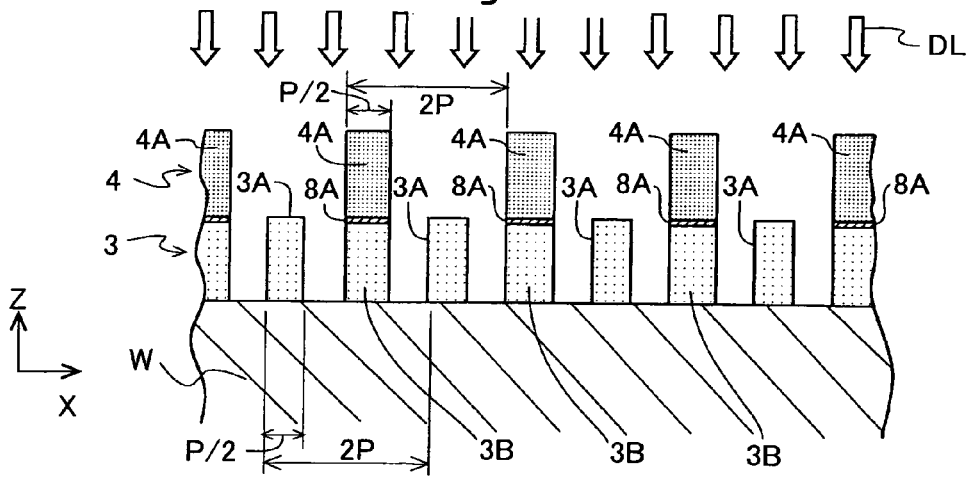

Also in this embodiment, as shown in FIG. 7B, the positive resist 4 of the wafer W is exposed with the image of the L & S pattern having the period 2P in the X direction as represented by the approximately sine wave-shaped light amount distribution curve 5P corresponding to Step 103. Simultaneously with this, the negative resist 3 of the wafer W is exposed with the image of the L & S pattern having the period 2P as represented by a light amount distribution curve 5N in which the level of the light amount distribution curve 5P is compressed or reduced, for example, to about 1/6 in accordance with the action of the dimming layer 8.

In this case, the photosensitive level Thp of the positive resist 4 is set so that periodic areas 6A (exposed portions), each of which has the width in the X direction of 3P/2, are at not less than the photosensitive level Thp in relation to the light amount distribution curve 5P. The photosensitive level Thn of the negative resist 3 is the same as the photosensitive level Thp. However, the photosensitive level Thn is set such that periodic areas 7A (exposed portions), each of which has the width in the X direction of P/2, are at not less than the photosensitive level Thn in relation to the light amount distribution curve 5N. Therefore, on the assumption that the light amount distribution curve 5P is the sine wave in relation to the position X, if the minimum value of the light amount distribution curve 5P is zero (0), and the maximum value is EP, then the photosensitive levels Thp, Thn are represented by the foregoing expression (1) respectively.

After that, the development step in the Z direction, which corresponds to Step 104 shown in FIG. 6, is executed. By doing so, as shown in FIG. 7C, exposed portions 3A and undeveloped portions 3B having the widths of P/2, which are included in the negative resist 3, are allowed to remain on the wafer W at the period 2P, and unexposed portions 4A of the positive resist 4 are allowed to remain on the undeveloped portions 3B with boundary portions 8A of the dimming layer 8 intervening therebetween. That is, a resist pattern, which has the period P that is approximately 1/2 of the resolution limit of the exposure apparatus 100, is formed on the wafer W. Therefore, the L & S pattern having the period P can be formed on the wafer W by executing the steps corresponding to Steps 105, 106 shown in FIG. 6 thereafter.

According to this embodiment, the following function and the effect are provided in addition to the function and the effect of the first embodiment.

(1) The dimming layer 8 (intermediate layer), which has the predetermined transmittance with respect to the illumination light (exposure light), is formed between the negative resist 3 and the positive resist 4 on the wafer W. Therefore, by controlling the transmittance of the dimming layer 8, then even if the sensitivities (photosensitive levels) of the negative resist 3 and the positive resist 4 are set to be equal to one another, for example, it is possible to form the fine pattern which exceeds the resolution limit of the exposure apparatus 100 on the wafer. Accordingly, it is easy to manage the negative resist 3 and the positive resist 4; and the L & S pattern can be formed on the wafer highly accurately only by controlling the exposure amount highly accurately with the exposure apparatus 100.

(2) The portions, of the dimming layer 8, which are different from the boundary portions 8A are removed during the development in Step 104. Therefore, the dimming layer 8 does not affect the shape of the L & S pattern to be finally formed.

(3) In FIG. 7A, the lower layer, which is disposed under or below the dimming layer 8, is the negative resist 3, and the upper layer is the positive resist 4. Therefore, the exposure amount is decreased with respect to the negative resist 3. Therefore, it is easy to provide the equal sensitivity for the negative resist 3 and the positive resist 4.

(4) The method for forming the pattern of this embodiment includes the steps of forming the negative resist 3, the dimming layer 8, and the positive resist 4 on the wafer W (Step 101, the coating step of the dimming layer 8, and Step 102); Step 103 of exposing the negative resist 3, the dimming layer 8, and the positive resist 4 of the wafer W with the pattern of the reticle R; and Step 104 of developing the negative resist 3, the dimming layer 8, and the positive resist 4 on the wafer W.

According to this embodiment, the fine pattern, which exceeds the resolution limit of the exposure apparatus, can be formed by using, for example, the easy lithography process in which the sensitivity of the negative resist 3 is equal to that of the positive resist 4, without performing the overlay exposure.

Third Embodiment

Next, a third embodiment of the present invention will be explained with reference to FIG. 8. Parts or components shown in FIGS. 8A to 8D, which correspond to those shown in FIGS. 4A to 4C and FIGS. 5A to 5C, are designated by the same reference numerals, any detailed explanation of which will be omitted. The pattern forming system shown in FIG. 1A is also used in this embodiment. However, this embodiment differs in that only the ordinary development is performed, and that it is unnecessary to perform the anisotropic development.

Figure 8A:
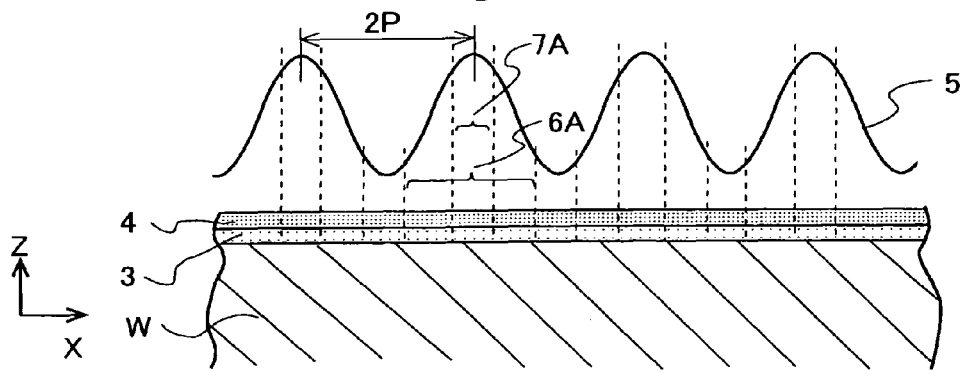
FIGS. 8A to 8D are magnified sectional views each illustrating a part of a surface of a wafer, depicting the change of the states of a dimming layer and two resist layers, etc. coated on the wafer in a third embodiment of the present invention.

That is, in this embodiment, as shown in FIG. 8A, the wafer W is coated with a negative resist 3 having the low sensitivity and a positive resist 4 having the high sensitivity, and the wafer W is exposed with the image of the L & S pattern having the period 2P as depicted by the light amount distribution curve 5. An area 7A, in which the negative resist 3 is exposed, has the width P/2, and an area 6A, in which the positive resist 4 is exposed, has the width 3P/2. However, the thicknesses of the resists 3, 4 are set to be relatively thin with respect to the period 2P.

Figure 8B:
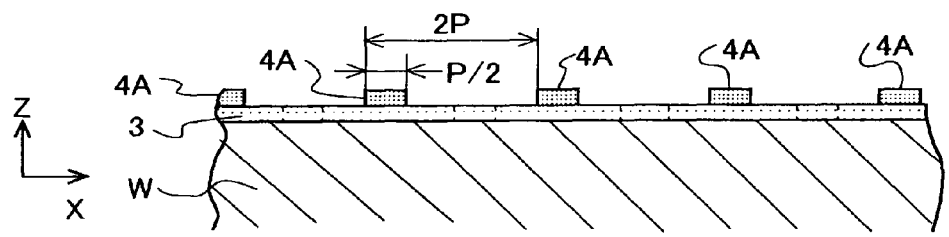
Figure 8C:
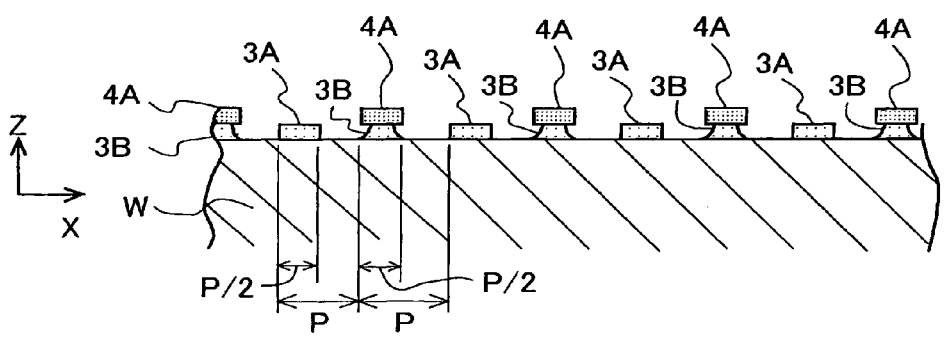
Figure 8D:
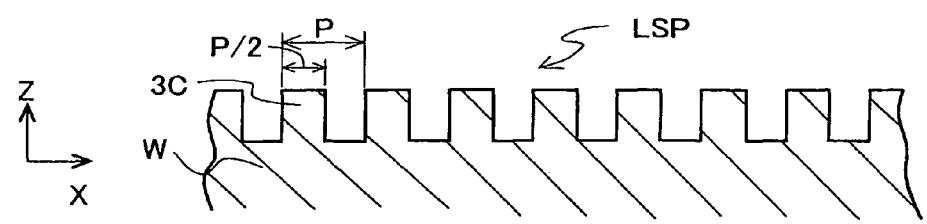

After that, the ordinary development (for example, the wet development) is performed for only the positive resist 4 on the wafer W by using a developing solution developing only the positive resist 4. By doing so, as shown in FIG. 8B, unexposed portions 4A each having the width P/2 are allowed to remain at the period 2P. After that, the ordinary development (for example, the wet development) is performed for only the negative resist 3 on the wafer W by using a developing solution developing only the negative resist 3. By doing so, as shown in FIG. 8C, exposed portions 3A each of which has the width of P/2 and undeveloped portions 3B each of which has the width of the bottom surface of about P/2 and in each of which both end portions are dissolved while being covered with one of the unexposed portion 4A are allowed to remain at the period P. After that the etching, etc. is performed by using the resist pattern shown in FIG. 8C as a mask layer. Thus, as shown in FIG. 8D, the L & S pattern LSP having the period P is formed on the wafer W.

As described above, according to this embodiment, by forming the resists 3, 4 to be thin, it is possible to form the resist pattern, in which the widths of the line portions and the space portions are approximately at the ratio of 1:1 and the period is approximately regarded as P, on the wafer W by performing only the ordinary development. Thus, the pattern, which exceeds the resolution of the exposure apparatus, can be formed on the wafer W by using the resist pattern.

Fourth Embodiment

An explanation will be made with reference to a flow chart shown in FIG. 12 about an example of the pattern formation process using the pattern forming system of this embodiment. In this case, for example, it is assumed that an L & S pattern having a period (pitch) P is formed on the wafer W in the same manner as in the embodiment described above.

An L & S pattern (or may be phase shift pattern or the like), in which the period in the X direction of the image brought about by the projection optical system PL of the exposure apparatus 100 is 2P, is formed in a pattern area of a reticle R shown in FIG. 1B.

Further, in this embodiment, the silylation for making silicon (Si) be adhered to the vicinity of a surface of the exposed position of the predetermined resist, is performed during the process in which a plurality of layers of resists on the wafer are developed by using the coater/developer 200 shown in FIG. 1A. The silylation in the lithography step has been hitherto used in order that the etching resistance of the developed resist is improved and/or that when the exposed resist is etched by RIE, etc., the durability of the resist against the RIE is improved, as disclosed, for example, in Japanese Patent Application Laid-open Nos. 2000-182923 and 2001-135565. In this application, the silylation is used so as to improve the resistance of the exposed portion of a predetermined resist against the developing solution, as will be described later on.

FIGS. 9A to 9C, FIGS. 10A to 10C, and FIGS. 11A to 11C, which are used in the following description, each show a magnified sectional view of a part of the surface of the wafer W during a series of steps of the pattern formation. It is assumed that the X direction extends in the periodic direction of the L & S pattern formed on the wafer W, and the Z direction extends in the normal line direction of the surface of the wafer W.

Figure 9A:
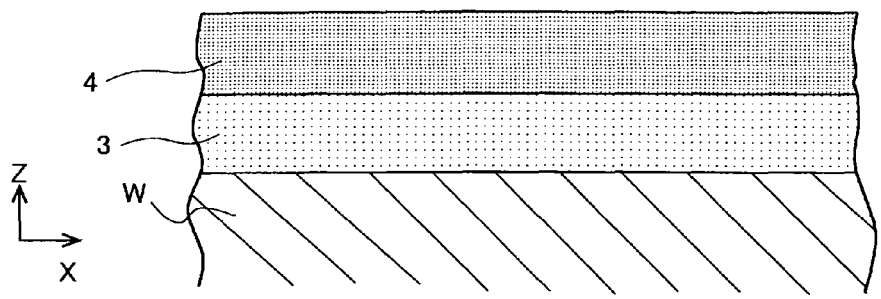
FIGS. 9A to 9C are magnified sectional views each illustrating a part of a surface of a wafer, depicting the change of the states of two resist layers coated on the wafer in a fourth embodiment of the present invention.

At first, a thin film (not shown) for forming the pattern is formed on a surface of the wafer W made of the semiconductor wafer by using the unillustrated thin film-forming apparatus (not shown). Subsequently, the wafer W is transported to the coater/developer 200 shown in FIG. 1A; and as shown in FIG. 9A, on the surface of the wafer W, a negative resist (negative type silylation resist) 3 having a low sensitivity (requiring a large exposure amount) and having a silylating characteristic is coated with a thickness of about 40 to 200 nm (see Step 201 shown in FIG. 12). Subsequently in Step 202, on the negative resist 3 of the wafer W, an ordinary positive resist 4 having a high sensitivity (requiring a small exposure amount) and undergoing no silylation is coated with a thickness of about 40 to 200 nm. The sensitivities of the negative resist 3 and the positive resist 4 will be described later on. The information about the sensitivities of the resists is stored in a storage device included in the main controller 20. It is allowable that, as necessary, the wafer W may be pre-baked after the negative resist 3 is coated on the wafer W and/or after the positive resist 4 is further coated on the negative resist 3.

Figure 9B:
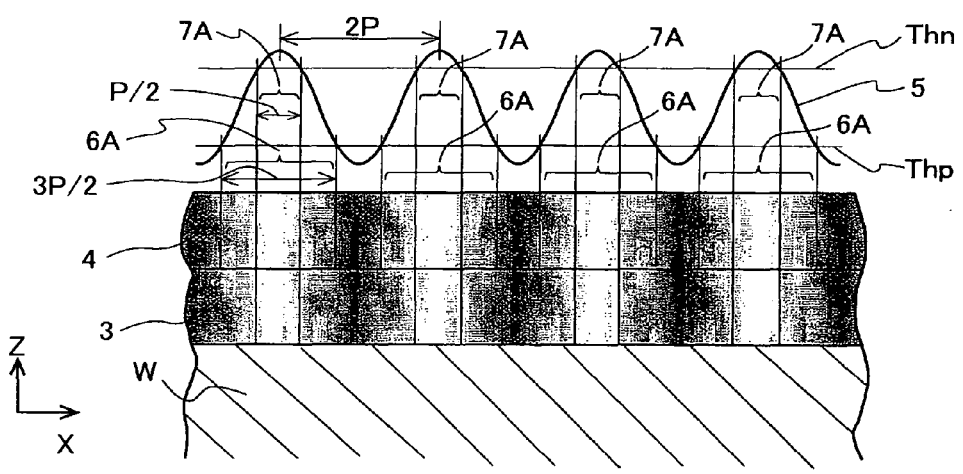

Subsequently in Step 203, the wafer W on which the two layers of resists (two resist layers) are coated is transported onto the wafer stage WST of the exposure apparatus 100 shown in FIG. 1B, and the respective shot areas of the wafer W are exposed with the image of the L & S pattern of the reticle R via the projection optical system PL. As a result, as shown in FIG. 9B, in each of the shot areas on the wafer W, the negative resist 3 and the positive resist 4 are exposed with the image of the L & S pattern having the period (pitch) 2P in the X direction as represented, for example, by a substantially sine wave-shaped light amount distribution curve 5.

In this case, a photosensitive level (threshold value) Thp of the positive resist 4 having the high sensitivity is set so that areas 6A, each of which has a width in the X direction of about 3P/2 with a position of the maximum light amount in relation to the light amount distribution curve 5 as the center, is at not less than the photosensitive level Thp. Therefore, the areas 6A periodically appear at the period of 2P in the X direction. The area 6A corresponds to an exposed portion (portion which is removed by the development) of the positive resist 4; and the width ratio in the X direction between the exposed portion and the unexposed portion is about 3:1. On the other hand, a photosensitive level (threshold value) Thn of the negative resist 3 having the low sensitivity is set so that areas 7A, each of which has a width in the X direction of about P/2 with a position of the maximum light amount in relation to the light amount distribution curve 5 as the center, is at not less than the photosensitive level Thn. Therefore, the areas 7A periodically appear at the period of 2P in the X direction. The area 7A corresponds to an exposed portion 3A (portion which is allowed to remain after the development) of the negative resist 3 shown in FIG. 9C; and the width ratio between the exposed portion and the unexposed portion is about 1:3. Each of the exposed portions 3A of the negative resist 3 is also a silylation reaction portion. Each of the areas 7A is positioned at the center of one of the areas 6A.

It is also possible to state, when the wafer is exposed with an image of the light amount distribution curve 5, with the sensitivity of the resist at which the width ratio in the X direction between the exposed position and the unexposed portion is approximately 1:1 as the reference, that the sensitivity of the negative resist 3 is low and the sensitivity of the positive resist 4 is high. It is assumed that, in the same manner as in the first embodiment, the light amount distribution curve 5 is the sine wave in relation to the position X, the minimum value of the light amount distribution curve 5 is zero (0), and the maximum value (preset exposure amount to be brought about by the exposure apparatus) is EP. On this assumption, the photosensitive levels Thp, Thn are represented by the expressions (1) to (3) described above.

Therefore, it is appropriate that the photosensitive level Thn of the negative resist 3 having the low sensitivity is set to be approximately six times the photosensitive level Thp of the positive resist 4 having the high sensitivity. In this case, by determining the actual exposure amount EP, for example, such that the width of the exposed area 7A is P/2, then the width of the exposed area 6A is approximately 3P/2. Actually, the photosensitive levels Thn, Thp can be determined depending on the development characteristic, the shape of the light amount distribution curve 5, etc.

Figure 9C:
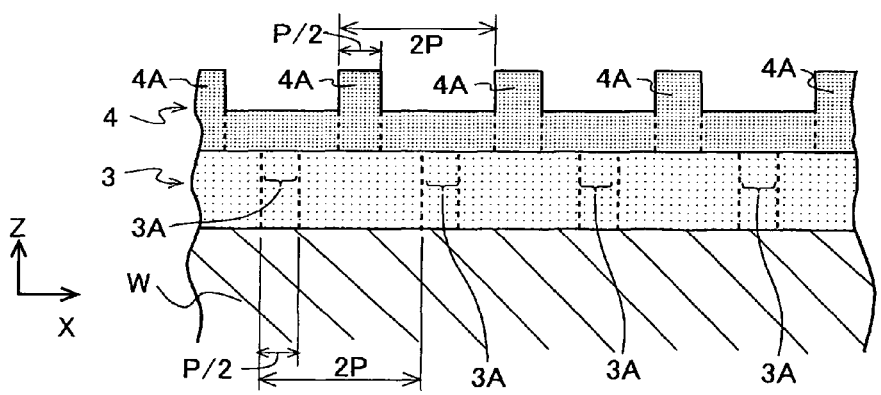

Subsequently in Step 204, the wafer W after the exposure (exposed wafer W) is transported from the exposure apparatus 100 to the coater/developer 200 shown in FIG. 1A to perform PEB (post-exposure bake) as the baking before the development for the wafer W in order to reduce the standing wave effect, if necessary. After that, the ordinary development (for example, the wet development) is performed for the positive resist 4 on the wafer W. As a result of this development, as shown in FIG. 9C, the exposed portions (corresponding to the areas 6A shown in FIG. 9B), which are disposed between the unexposed portions 4A having the widths of approximately P/2 and the period 2P of the positive resist 4, are gradually dissolved. The development for the positive resist 4 is stopped at a point in time at which the exposed portions of the positive resist 4 are completely dissolved and removed and only the unexposed portions 4A are allowed to remain as shown in FIG. 10A.

Subsequently in Step 205, in order to silylate the exposed portions 3A of the negative resist 3 on the wafer W, as shown in FIG. 10B, a silylation gas SG containing silicon (Si), which includes, for example, HMDS (hexamethyldisilazane), is made to flow against the surfaces of the negative resist 3 and the positive resist 4 of the wafer W at a temperature of about 150° C. so as to heat the wafer W. As a result, as shown in FIG. 10B, silylated portions 3S, to which the material containing silicon that is highly resistant to the etching is deposited or adhered, are formed on only the surfaces of the exposed portions 3A of the negative resist 3.

If the ordinary development is performed thereafter, then the areas 3B of the negative resist 3 (hereinafter referred to as "undeveloped portions") shown in FIG. 10C, each of which is disposed on a side of the bottom surface of one of the unexposed portions 4A of the positive resist 4, are also developed, and portions of the negative resist 3 different from the exposed portions 3A are consequently all removed. In order to avoid this inconvenience, in this embodiment, the anisotropic development is subsequently performed in Step 206. The development (etching) is performed for the negative resist 3 and the positive resist 4 on the wafer W in order to uniformly and gradually remove the portions other than the exposed portions 3A. This step is performed by blowing a liquid DK which dissolves the negative resist 3 (unsilylated portions) and the positive resist 4. Therefore, the development can be also referred to as "dry development" or "resist etching" (etching for removing both of the negative resist and the positive resist).

Figure 11A:
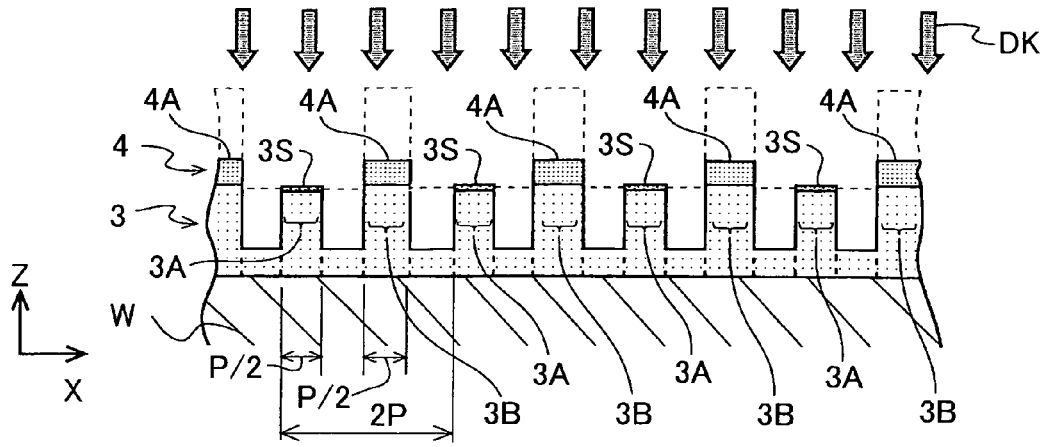
Figure 11B:
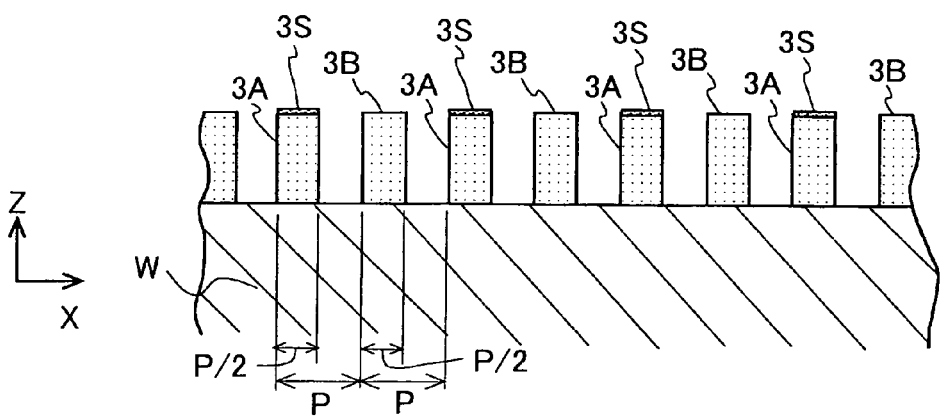

That is, as shown in FIG. 10C as an example, the liquid DK is blown against the wafer W in the Z direction for a predetermined period of time from a nozzle (not shown) disposed over or above the wafer W. In this case, the silylated portions 3S are formed on the surfaces of the exposed portions 3A of the negative resist 3. Therefore, the exposed portions 3A reliably remain. As shown in FIG. 10C and FIG. 11A, the unexposed portions 4A of the positive resist 4 and the portions of the negative resist 3 disposed between the exposed portions 3A and the undeveloped portions 3B are removed at an approximately same velocity in accordance with the dry development (because the negative resist 3 (unsilylated portions) and the positive resist 4 have a same solubility with respect to the liquid DK). The dry development is stopped at a point in time at which the portions disposed between the undeveloped portions 3B and the exposed portions 3A of the negative resist 3 are completely removed as shown in FIG. 11B. At this point in time, almost all of the unexposed portions 4A of the positive resist 4 are also removed (because the thickness of the positive resist 4 is made to be approximately same as that of the negative resist 3 in this embodiment). Therefore, the exposed portions 3A each having approximately the width P/2 and the undeveloped portions 3B each having approximately the width P/2 and having been covered with one of the unexposed portions 4A of the positive resist 4 are allowed to remain on the wafer W. The undeveloped portions 3B are positioned at the centers between the exposed portions 3A. Therefore, a negative type resist pattern, in which the exposed portions 3A each having the width P/2 and the undeveloped portions 3B each having the width P/2 are arranged in the X direction at the period P, is allowed to remain on the wafer W. That is, the pattern, in which the protrusions each having the width P/2 appear at the period P in the X direction, is formed on the wafer W.

Figure 11C:
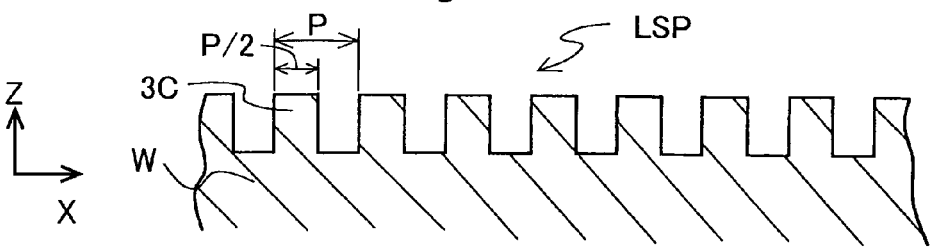

Subsequently in Step 207, in order to perform the pattern formation by using the resist pattern as the mask layer on the wafer W, the wafer W is transported to the etching apparatus 300 shown in FIG. 1A to perform the substrate processing including the heating (curing), the etching, etc. for the wafer W. Subsequently in Step 208, the negative type resist pattern on the wafer W is exfoliated. By doing so, as shown in FIG. 11C, an L & S pattern LSP, in which the protruding line portions 3C each having approximately the width P/2 are arranged in the X direction at the period P, is formed on the thin film portion of the surface of the wafer W. Assuming that the period 2P of the image of the L & S pattern represented by the light amount distribution curve 5 shown in FIG. 9B is, for example, 80 nm, the period P of the L & S pattern LSP shown in FIG. 11C is 40 nm.

In this way, according to this embodiment, the fine L & S pattern LSP, which has the period P that is ½ of the resolution limit (period 2P) of the exposure apparatus 100, can be formed on the wafer W.

After that, in the next step of Step 209, for example, the lithography process is repeated for the wafer W, as necessary.

The function, the effect, etc. of this embodiment are as follows.

(1) In the pattern formation process of this embodiment, the resist pattern, which is approximately ½ of the resolution limit of the exposure apparatus 100, is formed on the wafer W by executing the lithography process (lithography step) once, the lithography step including Steps 201, 202 (coating step) of coating, on the surface of the wafer W, the negative resist 3 and the positive resist 4 having the different photosensitive characteristics; Step 203 (exposure step) of simultaneously exposing the negative resist 3 and the positive resist 4 on the wafer W with the image of the pattern of the reticle R by the exposure apparatus 100; and Steps 204 to 206 (development step) of developing the negative resist 3 and the positive resist 4 on the wafer W including the silylation process. Taking the notice of the number of time of the exposure, the formation of the resist pattern of approximately ½ of the resolution limit is realized by performing the exposure only once.

Therefore, the fine pattern, which exceeds the resolution limit of the exposure apparatus, can be formed by using the lithography process without performing the overlay exposure.

(2) Those carried out in the development step include Step 204 of developing the positive resist 4; Step 205 of silylating the surfaces of the exposed portions 3A of the negative resist 3 so that the surfaces of the exposed portions 3A are hardly soluble in the developing solution (to enhance the resistance); and Step 206 of performing the dry development (etching) for the negative resist 3 and the positive resist 4. Therefore, only the exposed portions 3A of the negative resist 3 and the unexposed portions 3B, of the negative resist 3, having been covered with the unexposed portions 4A of the positive resist 4 are allowed to remain by the dry development. Therefore, the resist pattern, which has the period of ½ of the resolution limit of the exposure apparatus, can be efficiently formed on the wafer W.

In order to enhance the resistance of the exposed portions 3A of negative resist 3 against the developing solution, any process other than the silylation may be used.

(3) In Step 206, the negative resist 3 and the positive resist 4 are developed (etched) in the Z direction perpendicular to the surface of the wafer W. Therefore, as shown in FIG. 11B, it is possible to form the satisfactory resist pattern in which the contour of the cross-sectional shape is perpendicular to the surface of the wafer W.

However, it is enough that the contour of the cross section of the resist pattern is approximately perpendicular to the surface of the wafer W. Therefore, it is also enough that the direction of the development is approximately parallel to the Z direction. In particular, as the thicknesses of the negative resist 3 and the positive resist 4 are smaller, the allowance of the deviation of the development direction from the Z direction is more increased.

(4) In this embodiment, the dry development, which is the etching acting on both of the positive resist and the negative resist, is performed as the development in Step 206. Instead of this, it is also allowable to perform a development which acts on only the negative resist 3 (anisotropic dry development in which a plasmic developing solution is blown). In this case, the unexposed portions 4A of the positive resist 4 are allowed to remain after the development. Therefore, it is preferable to execute a step of exfoliating only the unexposed portions 4A.

Alternatively, as for the anisotropic development, the developing solution may be in a state of high pressure steam or vapor, and may be jetted from a position over or above the wafer (in the Z direction). In this case, only predetermined portions (portions between the exposed portions 3A and the undeveloped portions 3B in relation to the negative resist 3) are removed in accordance with the synergistic effect of the chemical reaction and the physical action.

(5) As shown in FIG. 9B, the first layer on the wafer W is the negative resist 3, and the second layer is the positive resist 4 having the sensitivity higher than that of the negative resist 3. Therefore, the resist pattern, which has the period that is smaller than the period of the exposure pattern, i.e., the period of ½ of the period of the exposure pattern in this embodiment, can be formed after Step 206.

In FIG. 9B, the decrease in the light amount (light amount distribution curve 5) of the illumination light (projected image), which is caused, for example, by the light absorption in the positive resist 4, is neglected. However, actually, the light amount of the projected image is decreased when the light beam passes through the positive resist 4. Therefore, the sensitivity of the negative resist 3 can be set to be higher (photosensitive level Thn can be set to be lower) in some cases.

(6) It is allowable that the positive resist 4 is coated as the first layer on the wafer W, the negative resist 3 is coated as the second layer, and the sensitivity of the positive resist 4 is set to be higher than that of the negative resist 3 (photosensitive level Thp may be set to be lower than the photosensitive level Thn). Also in this construction, the resist pattern having the period P can be formed on the wafer W by performing the processes in accordance with Steps 204 to 206 respectively, although the order thereof differs. In this case, the process such as the silylation or the like for improving the resistance against the etching solution is applied to the unexposed portions 4A of the positive resist 4 in a step corresponding to Step 205.

(7) In the case of FIG. 9B, the sensitivity of the negative resist 3 is set to be low so that the ratio in the periodic direction (X direction) between the widths of the exposed portion 3A and the unexposed portion (dissolvable portion) is approximately 1:3; and the sensitivity of the positive resist 4 is set to be high so that the ratio in the X direction between the widths of the exposed portion (dissolvable portion) and the unexposed portion 4A is approximately 3:1. Accordingly, it is possible to highly accurately form, on the wafer W, the fine resist pattern in which the period is ½ and the ratio between the widths of the protrusion and the recess is approximately 1:1.

(8) In this embodiment, the wafer is exposed with the image of the one-dimensional L & S pattern. However, the wafer W may be exposed, for example, with an image of a two-dimensional L & S pattern having the periodicity in the X direction and the Y direction. In this case, a two-dimensional fine pattern can be finally formed on the wafer.

(9) The negative resist 3 and/or the positive resist 4 may be a multilayered resist film or multilayered resist films respectively.

Fifth Embodiment

Figure 12:
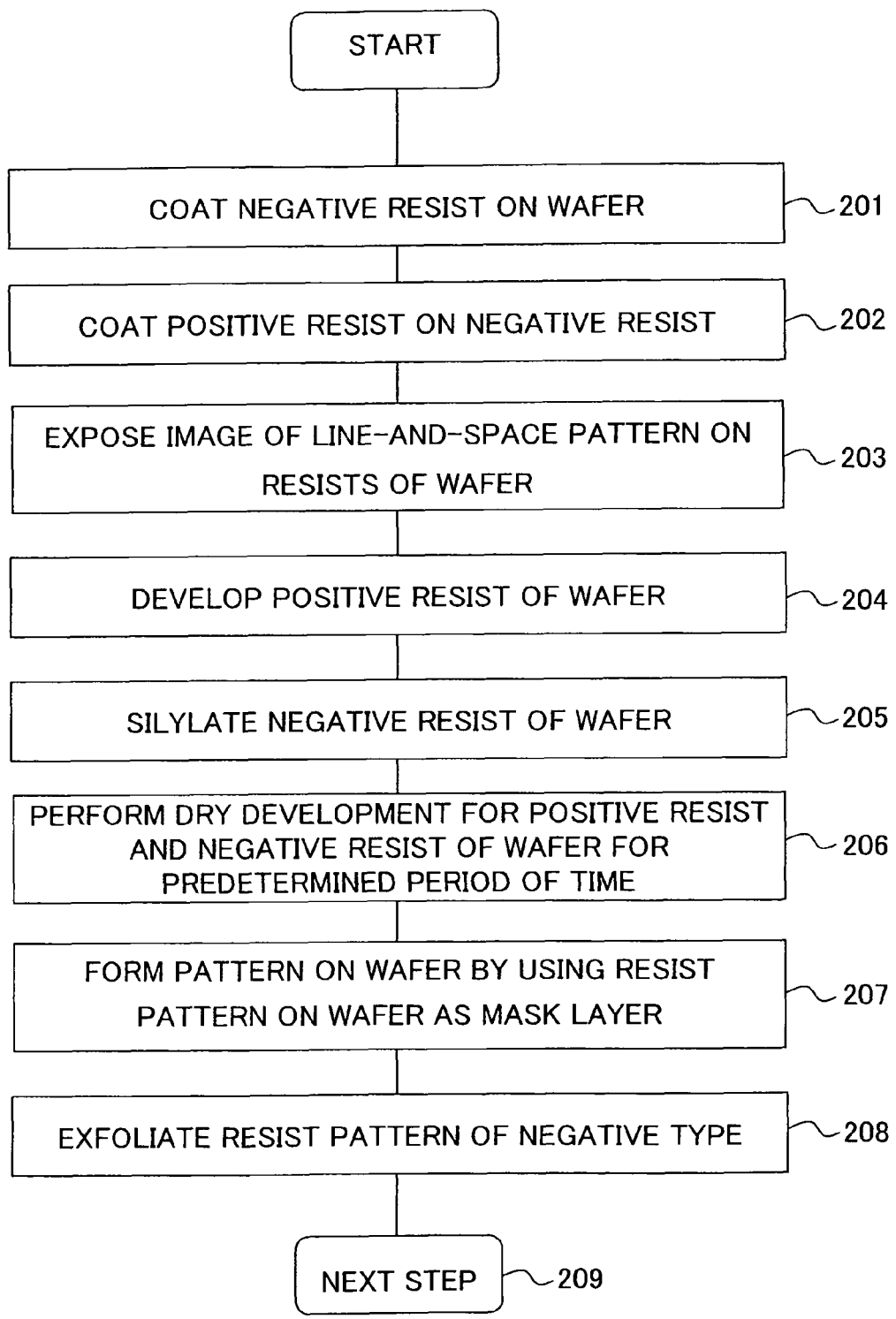
FIG. 12 shows a flow chart illustrating a pattern formation process of the fourth embodiment.
Figure 13A:
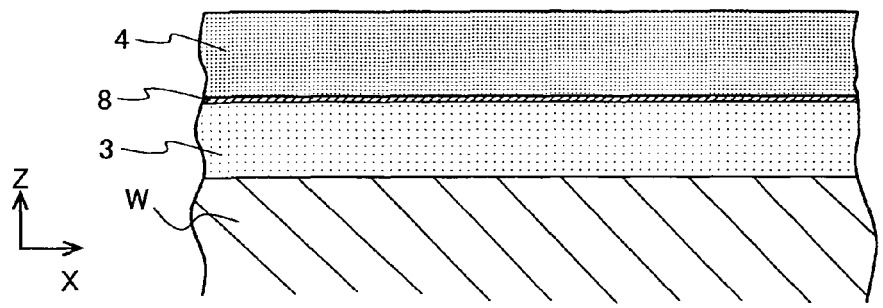
FIGS. 13A to 13C are magnified sectional views each illustrating a part of a surface of a wafer, depicting the change of the states of a dimming layer and two resist layers coated on the wafer in a fifth embodiment of the present invention.
Figure 13B:
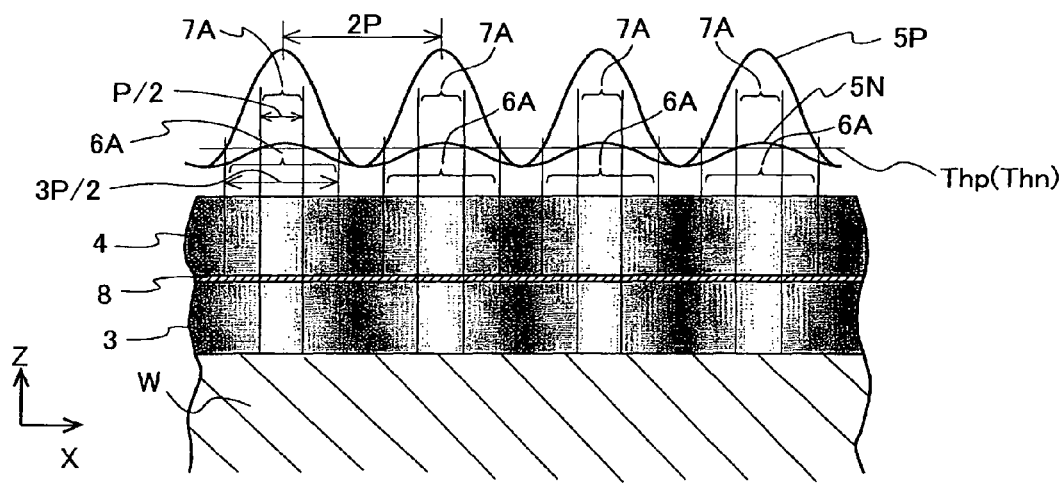
Figure 13C:
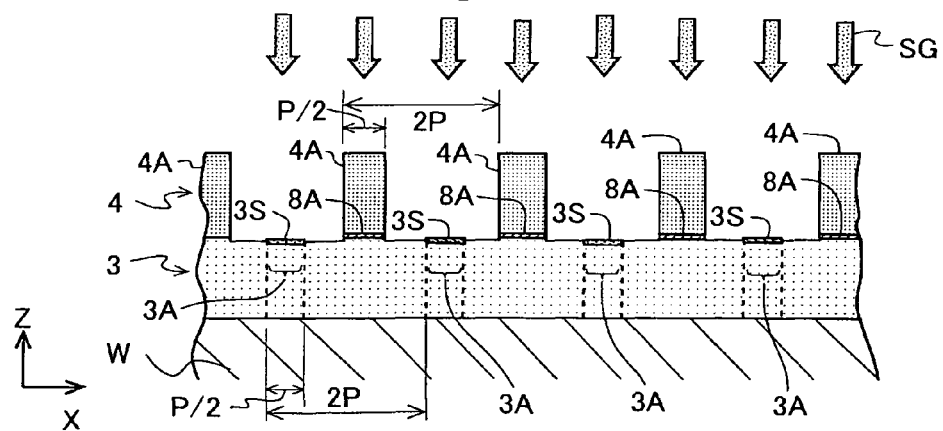

Next, a fifth embodiment of the present invention will be explained with reference to FIG. 13 (FIGS. 13A to 13C). Parts or components shown in FIGS. 13A to 13C, which correspond to those shown in FIGS. 9A to 9C and FIGS. 10A to 10C, are designated by the same reference numerals, any detailed explanation of which will be omitted. The pattern forming system shown in FIG. 1A is also used in this embodiment. However, a part of the method for forming the pattern on the wafer W is different from that shown in FIG. 12 as explained below.

That is, in this embodiment, a dimming layer 8, which has a predetermined transmittance with respect to the illumination light IL of the exposure apparatus 100 shown in FIG. 1B, is formed on the negative resist 3 between Step 201 and Step 202 shown in FIG. 12. As a result, when the step corresponding to Step 202 is completed, the negative resist 3, the dimming layer 8, and the positive resist 4 are formed and stacked on the wafer W as shown in FIG. 13A. The dimming layer 8 is formed of a material which is removed (dissolved) by the developing solution for the positive resist 4; and the transmittance of the dimming layer 8 can be controlled by the thickness of the dimming layer 8. In view of this point, the dimming layer 8 functions as a sensitivity-adjusting layer or exposure amount-adjusting layer for the negative resist 3. As an example, the transmittance of the dimming layer 8 is set, for example, to about ⅙ (17%) so that the sensitivity of the positive resist 4 is equal to the sensitivity of the negative resist 3. Therefore, in this embodiment, the sensitivity (photosensitive level) of the negative resist 3 is equal to that of the positive resist 4.

Also in this embodiment, as shown in FIG. 13B, the positive resist 4 of the wafer W is exposed with the image of the L & S pattern having the period 2P in the X direction as represented by the approximately sine wave-shaped light amount distribution curve 5P, corresponding to Step 203. Simultaneously with this, the negative resist 3 of the wafer W is exposed with the image of the L & S pattern having the period 2P as represented by a light amount distribution curve 5N in which the level of the light amount distribution curve 5P is compressed or reduced, for example, to about ⅙ in accordance with the action of the dimming layer 8.

In this case, the photosensitive level Thp of the positive resist 4 is set so that periodic areas 6A (exposed portions), each of which has the width in the X direction of 3P/2, are at not less than the photosensitive level Thp in relation to the light amount distribution curve 5P. The photosensitive level Thn of the negative resist 3 is same as the photosensitive level Thp. However, the photosensitive level Thn is set such that periodic areas 7A (exposed portions), each of which has the width in the X direction of P/2, are at not less than the photosensitive level Thn in relation to the light amount distribution curve 5N. Therefore, on the assumption that the light amount distribution curve 5P is the sine wave in relation to the position X, if the minimum value of the light amount distribution curve 5P is zero (0), and the maximum value is EP, then the photosensitive levels Thp, Thn are represented by the foregoing expression (1) respectively.

After that, the development is performed for the positive resist 4 corresponding to Step 204 shown in FIG. 12, and then the silylation is performed for the negative resist 3 by using the silylation gas SG corresponding to Step 205. As a result, as shown in FIG. 13C, the silylated portions 3S are formed on the exposed portions 3A, each having the width P/2, of the negative resist 3 on the wafer W; and the unexposed portions 4A, of the positive resist 4, each having the width P/2 are allowed to remain on the negative resist 3. Boundary portions 8A of the dimming layer 8 are allowed to remain between the negative resist 3 and the unexposed portions 4A. The boundary portions 8A may be allowed to remain as they are. Alternatively, the boundary portions 8A may be removed in a step corresponding to Step 206. Therefore, the L & S pattern having the period P can be thereafter formed on the wafer W by executing the steps ranging from Step 206 to Step 208 shown in FIG. 12.

According to this embodiment, the following function and the effect are provided in addition to the function and the effect of the fourth embodiment.

(1) The dimming layer 8 (intermediate layer), which has the predetermined transmittance with respect to the illumination light (exposure light), is formed between the negative resist 3 and the positive resist 4 on the wafer W. Therefore, by controlling the transmittance of the dimming layer 8, it is possible to form on the wafer a fine pattern, which exceeds the resolution limit of the exposure apparatus 100, even if, for example, the sensitivities (photosensitive levels) of the negative resist 3 and the positive resist 4 are set to be equal to one another. Accordingly, it is easy to manage the negative resist 3 and the positive resist 4; and the L & S pattern can be formed on the wafer highly accurately only by controlling the exposure amount highly accurately with the exposure apparatus 100.

That is, the fine pattern, which exceeds the resolution limit of the exposure apparatus, can be formed by using, for example, the easy lithography process in which the sensitivity of the negative resist 3 is equal to that of the positive resist 4, without performing the overlay exposure.

(2) Portions of the dimming layer 8 which are different from the boundary portions 8A are removed during the development in Step 204. Therefore, the dimming layer 8 does not affect the shape of the L & S pattern to be finally formed.

(3) In FIG. 13A, since the lower layer disposed under or below the dimming layer 8 is the negative resist 3 and the upper layer is the positive resist 4, the exposure amount is decreased with respect to the negative resist 3. Therefore, it is easy to provide the equal sensitivity for the negative resist 3 and the positive resist 4.

Figure 14:
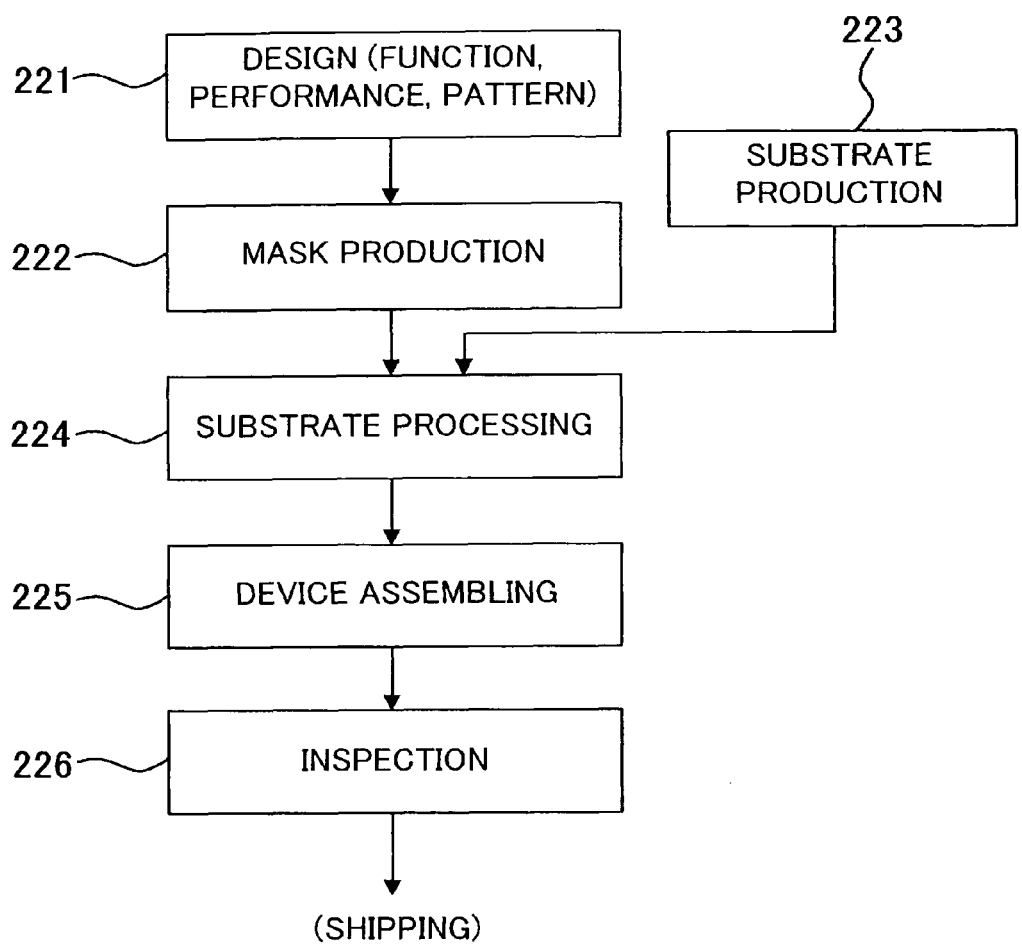
FIG. 14 shows a flow chart illustrating exemplary steps of producing an electronic device.

When an electronic device such as a semiconductor device (or a microdevice) is produced by using the exposure apparatus of the embodiment described above, the electronic device is produced, as shown in FIG. 14, by performing a step 221 of designing the function and the performance of the electronic device; a step 222 of manufacturing a mask (reticle) based on the designing step; a step 223 of producing a substrate (wafer) as a base material for the device and coating the resist on the substrate (wafer); a substrate-processing step 224 including a step of exposing the substrate (photosensitive substrate) with the pattern of the mask by the exposure apparatus (EUV exposure apparatus) or the exposure method of the embodiment described above, a step of developing the exposed substrate, a step of heating (curing) and etching the developed substrate, etc.; a step 225 of assembling the device (including processing processes such as a dicing step, a bonding step, and a packaging step); an inspection step 226; and the like. The steps of Steps 101 to 107 shown in FIG. 11 or the steps of Steps 201 to 207 shown in FIG. 12 of the embodiments described above are included in the steps 223 and 224 shown in FIG. 14. That is, a variety of devices can be produced by performing the known processes as carried out in this field, by using the pattern forming method of the present invention.

In this case, it is possible to highly accurately produce the electronic device having the fine pattern which exceeds the resolution of the exposure apparatus.

Although the pattern forming method has been specifically explained in accordance with the first to fifth embodiments as described above, it is possible to apply various modifications and changes thereto. For example, HMDS (hexamethyldisilazane) is used as the silylation gas SG in the embodiments described above. However, instead of this, it is possible to use, for example, tetramethyldisilazane, dimethylsilyldimethylamine, dimethylsilyldiethylamine, trimethylsilyldimethylamine, and trimethylsilyldiethylamine.

Each of the foregoing embodiments has been explained as exemplified by the exposure apparatus of the local liquid immersion type by way of example. However, the present invention is also applicable to a liquid immersion exposure apparatus of a type in which the entire wafer (substrate) is immersed in the liquid. In the foregoing embodiments, the optical path space (space between the end optical element and the substrate), which is disposed on the side of the image plane of the optical element arranged at the end portion of the projection optical system, is filled with the liquid. However, a projection optical system, in which the optical path space disposed on the side of the object plane (light-incident surface) of the optical element arranged at the end portion is also filled with the liquid, can be also adopted for the exposure apparatus as disclosed, for example, in United States Patent Application Publication No. 2005/0248856, etc. The present invention is also applicable to an exposure apparatus of the liquid immersion type in which the liquid immersion area disposed between the projection optical system and the substrate is held or retained by an air curtain formed therearound.

The present invention is not limited only to the projection exposure apparatus of the scanning exposure type. The present invention is also applicable to a case that the exposure is performed by using a projection exposure apparatus of the full field exposure type (stepper type) such as those of the step-and-repeat type. The present invention is also applicable to a case that the exposure is performed by using a dry type exposure apparatus, in addition to the case that the exposure is performed by using the liquid immersion type exposure apparatus. Further, the present invention is also applicable to a case that the exposure is performed by a projection exposure apparatus which uses an extreme ultraviolet light beam (EUV light) having a wavelength of several nm to 100 nm as the exposure light.

The present invention is also applicable to a case using an exposure apparatus (lithography system) in which an image of a line-and-space pattern is projected onto a wafer by forming interference fringes on the wafer as disclosed, for example, in International Publication No. 2001/035168.

The present invention is not limited to the application to the production process for the semiconductor device. The present invention is also widely applicable to a production process for a display device including, for example, a liquid crystal display device formed on a rectangular glass plate, a plasma display, etc. and a production process for various devices including, for example, an image pickup device (CCD, etc.), a micromachine, MEMS (Microelectromechanical Systems), a thin film magnetic head, a DNA chip, etc. Further, the present invention is also applicable to production steps when masks (photomasks, reticles, etc.) having mask patterns of various devices formed therein are produced by using the photolithography step. That is, the object, on which the pattern is formed, is not limited to the wafer. It is also allowable to use glass plates, ceramic substrates, film members, mask blanks, etc.; and the shapes thereof are not limited to the circular shapes as well, and may be, for example, rectangular shapes.

The pattern forming method of the present invention is also applicable to the case using a multi-stage type exposure apparatus provided with a plurality of stages as disclosed, for example, in U.S. Pat. No. 6,590,634, U.S. Pat. No. 5,969,441, and U.S. Pat. No. 6,208,407, and an exposure apparatus provided with a measuring stage having a measuring member (reference mark, sensor, etc.) as disclosed, for example, in International Publication No. 1999/23692, U.S. Pat. No. 6,897,963, etc.

The illumination light is not limited only to the ultraviolet light beam such as the ArF excimer laser beam. It is possible to use, for example, an X-ray exposure apparatus, an exposure apparatus using the charged particle beam such as the electron beam and the ion beam, etc. for the pattern forming method of the present invention.

In the respective embodiments described above, the reticle (light transmission type mask) is used, in which a predetermined light shielding pattern is formed on the light-transmissive substrate. However, instead of such a light-transmissive mask, it is also allowable to use an electronic mask (variable shaped mask) in which a transmissive pattern, a reflective pattern, or a light-emitting pattern is formed based on electronic data of the pattern to be subjected to the exposure, as disclosed, for example, in U.S. Pat. No. 6,778,257.

The disclosures of the respective patent documents, the respective international publications, United States patents, and United States patent application Publications are incorporated herein by reference.

As described above, it is a matter of course that the present invention is not limited to the embodiments described above, and may be embodied in other various forms within a scope without deviating from the gist or essential characteristics of the present invention.

According to the pattern forming method of the present invention, the fine pattern, which exceeds the resolution limit of the exposure apparatus, can be formed without performing the overlay exposure. Therefore, the present invention can remarkably contribute to the international development of the technical field of the formation of fine pattern, for example, the precision mechanical equipment industry including the semiconductor industry.

What is claimed is:

1. A pattern forming method for forming a pattern on an object, the method comprising:
    forming, on the object, first and second photosensitive layers having different photosensitive characteristics;
    exposing the first and second photosensitive layers via a pattern;
    performing a first development for developing the second photosensitive layer;
    converting a surface of an exposed portion or of an unexposed portion of the first photosensitive layer to be hardly soluble; and
    performing a second development for developing the first and second photosensitive layers.

2. The pattern forming method according to claim 1, wherein the conversion of the surface to be hardly soluble includes introducing a gas containing silicon into a surface of the first photosensitive layer and heating the object.

3. The pattern forming method according to claim 1, wherein the second development is performed by removing the first and second photosensitive layers in a predetermined direction.

4. The pattern forming method according to claim 3, wherein the predetermined direction is a direction perpendicular to a surface of the object.

5. The pattern forming method according to claim 3, wherein the first development is performed by removing the second photosensitive layer in a predetermined direction.

6. The pattern forming method according to claim 5, wherein the predetermined direction is a direction perpendicular to a surface of the object.

7. The pattern forming method according to claim 1, wherein the first photosensitive layer is of a negative type and the second photosensitive layer is of a positive type.

8. The pattern forming method according to claim 7, wherein a sensitivity of the first photosensitive layer is lower than a sensitivity of the second photosensitive layer.

9. The pattern forming method according to claim 1, wherein the first photosensitive layer is of a positive type and the second photosensitive layer is of a negative type.

10. The pattern forming method according to claim 9, wherein a sensitivity of the first photosensitive layer is higher than a sensitivity of the second photosensitive layer.

11. The pattern forming method according to claim 1, wherein sensitivities of the first and second photosensitive layers are different from each other.

12. The pattern forming method according to claim 1, further comprising forming an intermediate layer, which has a predetermined transmittance with respect to an exposure light, between the first and second photosensitive layers.

13. The pattern forming method according to claim 12, wherein a part of the intermediate layer is removed in the development.

14. The pattern forming method according to claim 12, wherein the first photosensitive layer is of a negative type and the second photosensitive layer is of a positive type.

15. The pattern forming method according to claim 1, wherein a period of the photosensitive layer on the object after the development is about ½ of a period of a light intensity distribution provided by an exposure light on the object via the pattern.

16. A pattern forming method for forming a pattern on an object, the method comprising:
    forming a first photosensitive layer, an intermediate layer, and a second photosensitive layer on the object;
    exposing the first photosensitive layer, the intermediate layer, and the second photosensitive layer via a pattern;
    performing a first development for developing the second photosensitive layer;
    converting a surface of an exposed portion or of an unexposed portion of the first photosensitive layer to be hardly soluble; and
    performing a second development for developing the first and second photosensitive layers.

17. The pattern forming method according to claim 16, wherein the first and/or second development includes removing the intermediate layer.

18. The pattern forming method according to claim 16, wherein the conversion of the surface to be hardly soluble includes introducing a gas containing silicon into a surface of the first photosensitive layer and heating the object.

19. The pattern forming method according to claim 16, wherein the second development is performed by removing the first and second photosensitive layers in a predetermined direction.

20. The pattern forming method according to claim 19, wherein the predetermined direction is a direction perpendicular to a surface of the object.

21. The pattern forming method according to claim 19, wherein the first development is performed by removing the second photosensitive layer in a predetermined direction.

22. The pattern forming method according to claim 21, wherein the predetermined direction is a direction perpendicular to a surface of the object.

23. The pattern forming method according to claim 16, wherein the first development includes removing at least a part of the intermediate layer.

24. The pattern forming method according to claim 16, wherein the intermediate layer has a predetermined transmittance with respect to an exposure light; and
the first photosensitive layer is of a negative type and the second photosensitive layer is of a positive type.

25. The pattern forming method according to claim 16, wherein a period of the photosensitive layer on the object after the development is about ½ of a period of a light intensity distribution provided by an exposure light on the object via the pattern.

26. A pattern forming method comprising:
forming a photosensitive lower layer on a substrate;
forming a photosensitive upper layer on the lower layer;
irradiating a light onto the upper layer formed on the lower layer via a predetermined pattern to simultaneously expose the upper layer and the lower layer with the light;
developing the exposed upper layer such that a first area corresponding to the predetermined pattern remains in the upper layer;
converting a surface of an exposed portion or of an unexposed portion of the lower layer to be hardly soluble;
developing the exposed lower layer and the first area of the upper layer such that a second area corresponding to the predetermined pattern and a masked area positioned under the first area of the upper layer remain in the lower layer; and
developing the substrate by using the second area and the masked area of the lower layer as masks to thereby form, on the substrate, a pattern corresponding to the second area and the masked area.

27. The pattern forming method according to claim 26, wherein the lower layer is a negative resist and the upper layer is a positive resist.

28. The pattern forming method according to claim 27, wherein the lower layer is developed by using the first area of the upper layer as a mask by anisotropic dry etching.

29. The pattern forming method according to claim 28, wherein the second area is silylated before the anisotropic dry etching.

30. The pattern forming method according to claim 29, wherein portions, of the lower layer, which are different from the silylated second area and the masked area of the lower layer are removed by the anisotropic dry etching.

31. The pattern forming method according to claim 30, wherein the first area of the upper layer is removed by the anisotropic dry etching.

32. The pattern forming method according to claim 26, further comprising forming a light shielding layer between the lower layer and the upper layer.

33. The pattern forming method according to claim 32, wherein the light shielding layer is removed when the upper layer is developed.

34. The pattern forming method according to claim 26, wherein the predetermined pattern includes a repeating pattern having a period 2P, the first area and the second area have different widths, and a sum of the widths of the first area and the second area is 2P.

35. The pattern forming method according to claim 26, wherein the predetermined pattern is a pattern having a period of about ½ of a resolution limit of an exposure apparatus for executing pattern formation.

36. A method for producing a device, comprising:
forming a pattern of a photosensitive layer on a substrate by using the pattern forming method as defined in claim 1; and
processing the substrate on which the pattern is formed.

37. A method for producing a device, comprising:
forming a pattern of a photosensitive layer on a substrate by using the pattern forming method as defined in claim 16; and
processing the substrate on which the pattern is formed.

38. A method for producing a device, comprising:
forming a pattern of a photosensitive layer on a substrate by using the pattern forming method as defined in claim 26; and
processing the substrate on which the pattern is formed.

* * * * *